(12) United States Patent
Chou

(10) Patent No.: US 8,110,475 B2
(45) Date of Patent: Feb. 7, 2012

(54) METHOD FOR FORMING A MEMORY DEVICE WITH C-SHAPED DEEP TRENCH CAPACITORS

(75) Inventor: Hou-Hong Chou, Taoyuan County (TW)

(73) Assignee: Inotera Memories, Inc., Taoyuan (TW)

( * ) Notice: Subject to any disclaimer, the term of this patent is extended or adjusted under 35 U.S.C. 154(b) by 497 days.

(21) Appl. No.: 12/244,343

(22) Filed: Oct. 2, 2008

(65) Prior Publication Data
US 2009/0242954 A1 Oct. 1, 2009

(30) Foreign Application Priority Data
Mar. 27, 2008 (TW) ............................... 97110956 A

(51) Int. Cl.
*H01L 21/20* (2006.01)
(52) U.S. Cl. ........ 438/386; 438/244; 438/243; 257/301; 257/E21.651
(58) Field of Classification Search .......... 438/243–249, 438/386–392; 257/301–305, E21.65, E21.651
See application file for complete search history.

(56) References Cited

U.S. PATENT DOCUMENTS

| 5,241,201 A | 8/1993 | Matsuo et al. |
| 6,188,096 B1 | 2/2001 | Collins et al. |
| 2005/0124132 A1 | 6/2005 | Tu |
| 2007/0032032 A1* | 2/2007 | Heineck et al. ............... 438/386 |

FOREIGN PATENT DOCUMENTS

| DE | 4430804 A1 | 3/1995 |
| DE | 10220584 B3 | 1/2004 |

* cited by examiner

Primary Examiner — Matthew Landau
Assistant Examiner — Candice Chan

(57) ABSTRACT

The invention is related to a memory device, including a substrate, a capacitor which is substantially C-shaped in a cross section parallel to the substrate surface and a word line coupling the capacitor. In an embodiment, the C-shaped capacitor is a deep trench capacitor, and in alternative embodiment, the C-shaped capacitor is a stack capacitor. Both inner edge and outer edge of the C-shaped capacitor can be used for providing capacitance.

5 Claims, 57 Drawing Sheets

METHOD FOR FORMING A MEMORY DEVICE WITH C-SHAPED DEEP TRENCH CAPACITORS

CROSS REFERENCE TO RELATED APPLICATIONS

This Application claims priority of Taiwan Patent Application No. 097110956, filed on Mar. 27, 2008, the entirety of which is incorporated by reference herein.

BACKGROUND OF THE INVENTION

1. Field of the Invention

The invention relates to a semiconductor device and fabrication thereof, and more particularly relates to a memory device and fabrication thereof.

2. Description of the Related Art

Integrated circuits, including dynamic random access memory (DRAM), are continuously being developed toward higher speeds and miniaturization. Additionally, it is important for memory devices to increase capacity. As a result, trench type capacitors, which have smaller sizes than conventional flat capacitors, have been developed to increase integrity.

FIG. 1 shows a plan view of a conventional deep trench dynamic random access memory. A plurality of oval-shaped deep trench capacitors 102, also referred as memory elements, are crossly arranged and controlled by word lines 106 extending in a vertical direction and bit lines extending in a horizontal direction. It is noted that this figure does not show the bit lines, but shows the active areas 104 under the bit lines. Because DRAM 100 integrity and density is required to be as high as possible, the memory units and transistors are required to be as small as possible with increased speed. However, the electrode plates of the memory units have insufficient areas to store electric charges. Specifically, as memory units shrink, fabrication of oval-shaped deep trench capacitors 102 encounter challenges during the etching process, wherein edge length surface areas of the oval-shaped deep trench 102 are not sufficient.

BRIEF SUMMARY OF INVENTION

According to the issues described, the invention provides a memory device, comprising a substrate, a capacitor having a C-shaped pattern at a cross section parallel to a surface of the substrate, and a word line coupling the capacitor.

The invention further provides a method for forming a memory device, comprising providing a substrate, forming a capacitor in the substrate or overlying the substrate, wherein the capacitor has a C-shaped pattern at a cross section parallel to a surface of the substrate, and a word line on the substrate is formed.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 2:
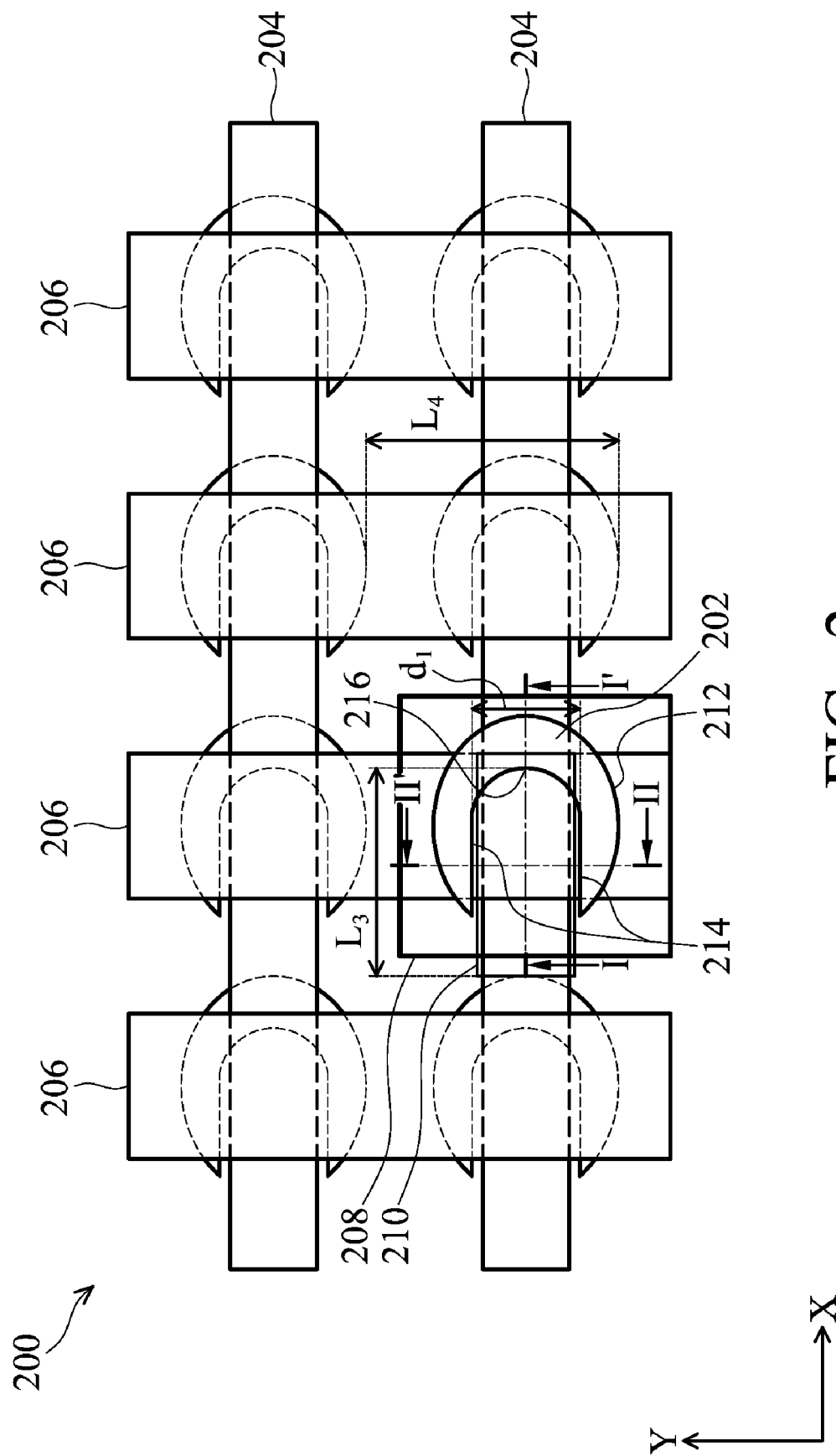
FIG. 2 shows a plan view of a memory device of an embodiment of the invention.

The memory device 200 of the embodiment is illustrated in accordance with FIG. 2, which shows a plan view of a memory device 200 of an embodiment of the invention. The primary purpose of the embodiment is to form a C-shaped deep trench capacitor 202 to increase capacitance. As shown in FIG. 2, a plurality of C-shaped deep trench capacitors 202 are disposed in a substrate and each C-shaped deep trench capacitor 202 substantially has a C-shaped profile at a cross section parallel to the substrate surface. Note that not only does the out edge 212 of the C-shaped profile of the C-shaped deep trench capacitor 202 provide surface area used for capacitance, but the inner edge 214 of the C-shaped profile of the C-shaped deep trench capacitor 202 also provides surface area so that total capacitance is increased. Hence, the C-shaped deep trench capacitor 202 of the embodiment of the invention has surface area greater than that of conventional oval-shaped or round-shape deep trench capacitors to have an extra area of two straight lines of the inner edge 214 of the C-shaped profile multiplied by depth of the deep trench capacitor 202.

A plurality of active areas 204 extend in direction X to pass the central portions 216 of the inner edges 214 of the C-shaped profiles of the deep trench capacitors, and a plurality of word lines 206, also referred to as gate lines, extend in direction Y to intersect the active areas 204. Note that the invention is not limited to the figure which shows width of the active area 204 less than the distance $d_1$ between the two wing portions of the C-shaped profiles of the deep trench capacitor 202. Alternatively, width of the active area 204 can be greater than the distance $d_1$ between the two wing portions of the C-shaped profiles of the deep trench capacitor 202. Further, an active area 210 of a unit cell of the embodiment can be arranged to be close to the central portion 216 of the inner edge 214 of the C-shaped profile of the deep trench capacitor 202 to reduce length of the active area 210. Comparing FIG. 1 with FIG. 2, length $L_3$ of the active area 210 of the unit cell of the memory device 200 of the embodiment is substantially ½ the length $L_1$ of the active area 210 of the conventional memory device 100. Accordingly, the active area 204 is used more efficiently and size of a unit cell 208 can be reduced. Furthermore, the unit cells 208 of the embodiment are substantially arranged to have a square shape and this square-shaped unit cells 208 can increase integrity of devices.

Figure 1:
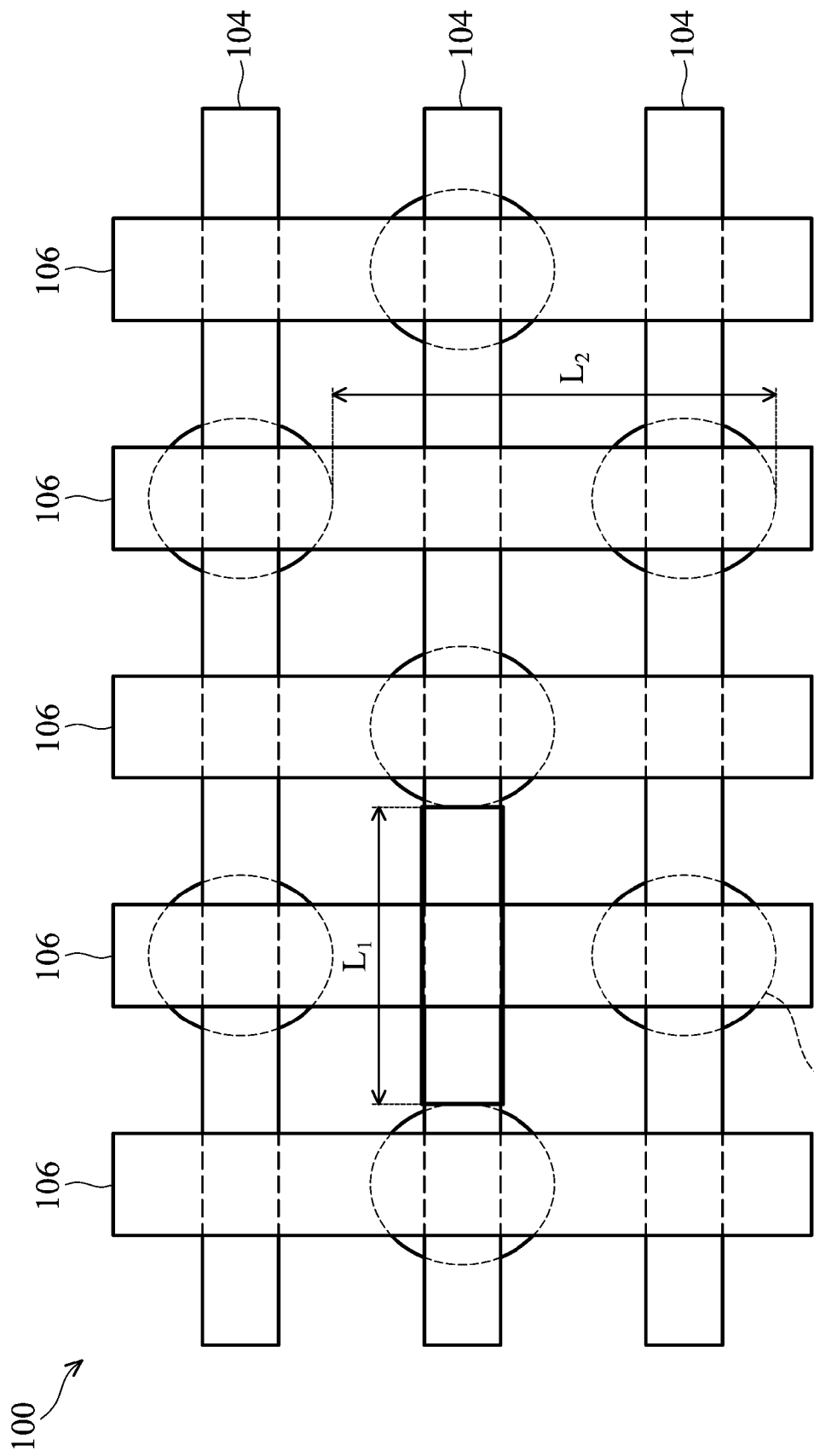
FIG. 1 shows a plan view of a conventional deep trench dynamic random access memory.

In addition, as shown in FIG. 2, width of the word line 206 of the device of the embodiment is greater than that of the word line 106 of the conventional device 100 shown in FIG. 1, and the word line 206 of the embodiment substantially covers two wing portions of the C-shaped profile of the deep trench capacitor 202. Moreover, the length $L_4$ of the word line 206 used by a single unit cell 208 is less than the length $L_2$ of the word line of a single cell of conventional memory device 100 (shown in FIG. 1) to provide lower resistance.

Figure 3:
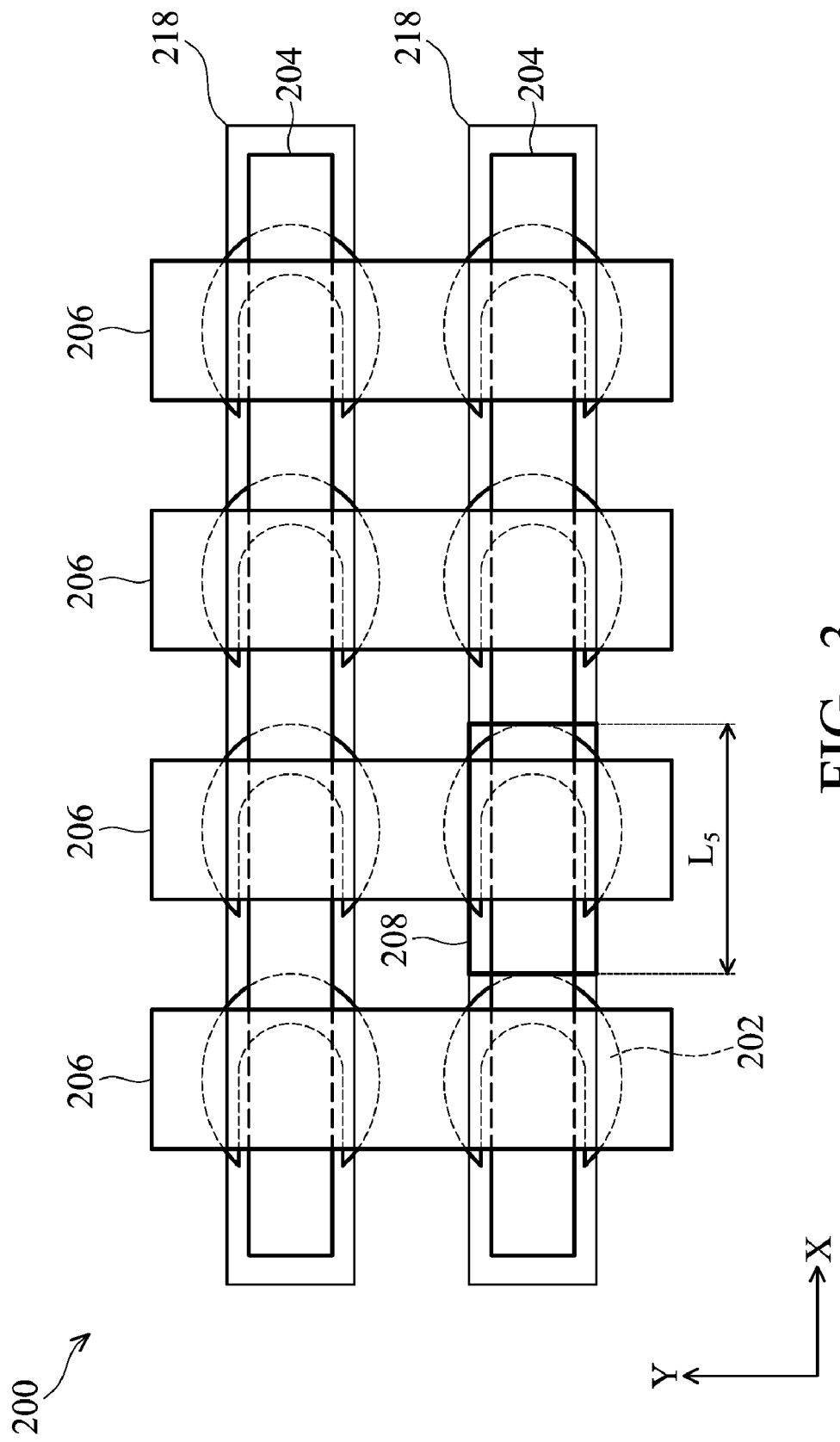
FIG. 3 shows a plan view of a memory device of an embodiment of the invention after formation of bit lines.

FIG. 3 shows a plan view of a memory device 200 of an embodiment of the invention after formation of bit lines 218, in which the bit lines 218 extend in direction X. Note that the embodiment can increase bit lines 218 widths in accordance with the arrangement of cells. As shown in this figure, the bit lines 218 of the embodiment substantially covers two wing portions of the C-shaped pattern, and the length $L_5$ of bit line 218 used by a single cell 208 is shorter than the conventional art to provide lower resistance.

Figure 4A:
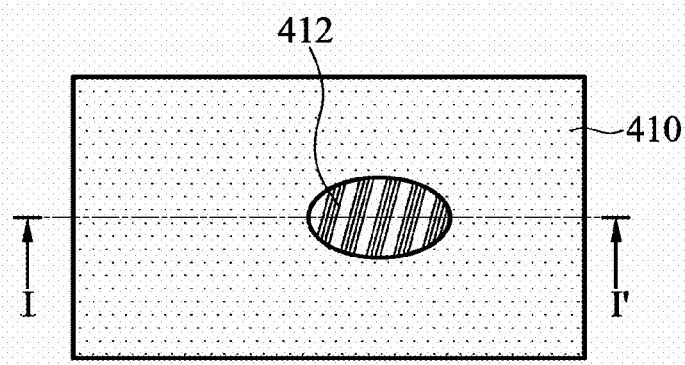
FIG. 4A shows the local plan view of the intermediate process step for forming the deep trench memory device of an embodiment of the invention.
Figure 4B:
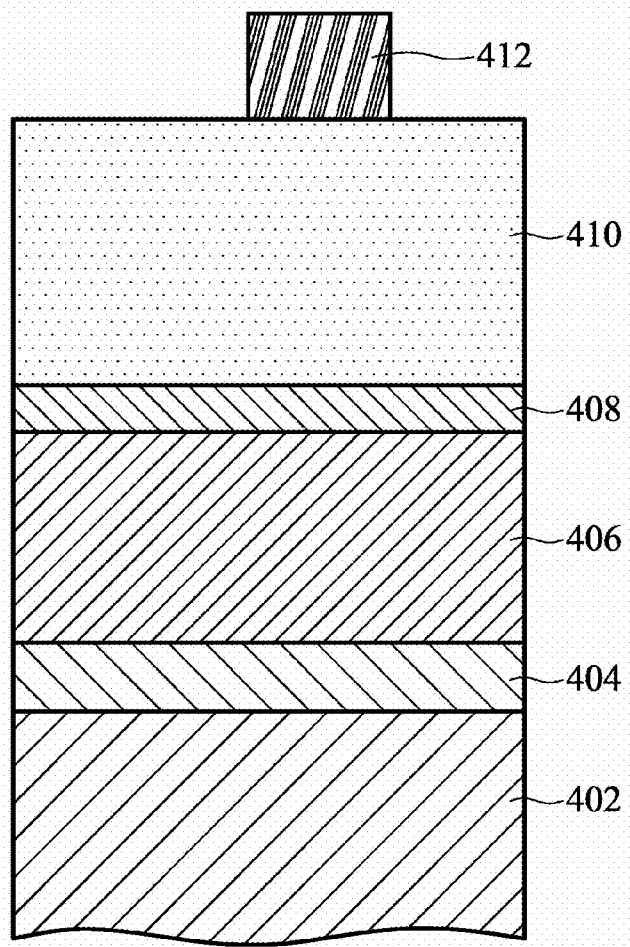
FIG. 4B shows a cross section along line I-I' of FIG. 4A.
Figure 5A:
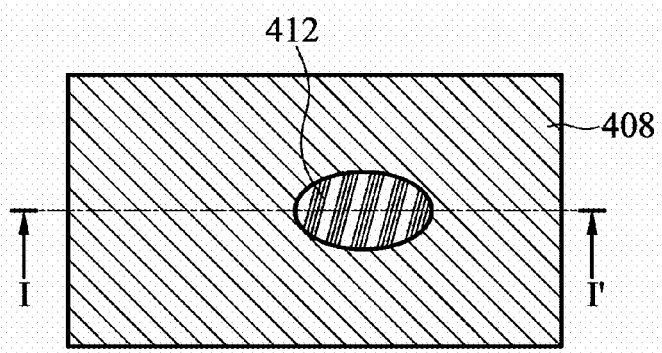
FIG. 5A shows the local plan view of the intermediate process step for forming the deep trench memory device of an embodiment of the invention.
Figure 5B:
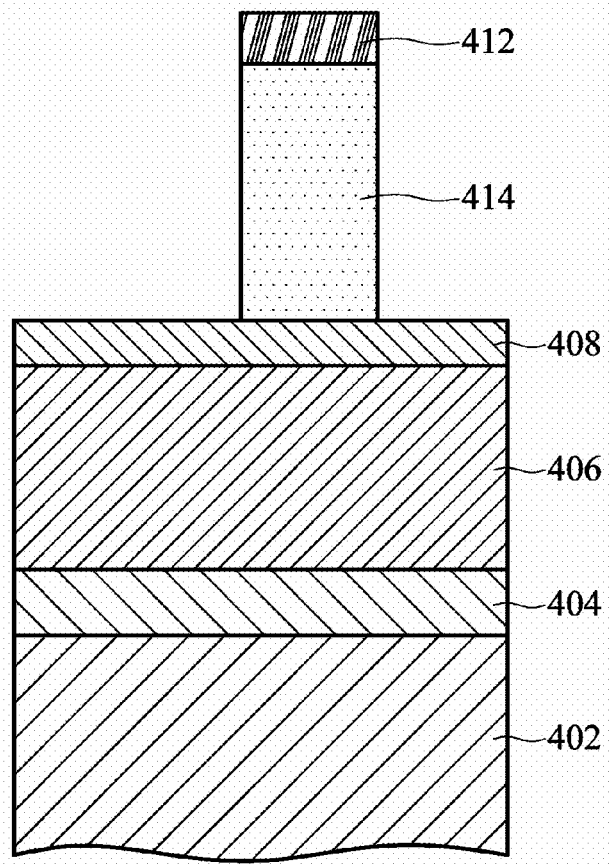
FIG. 5B shows a cross section along line I-I' of FIG. 5A.
Figure 6A:
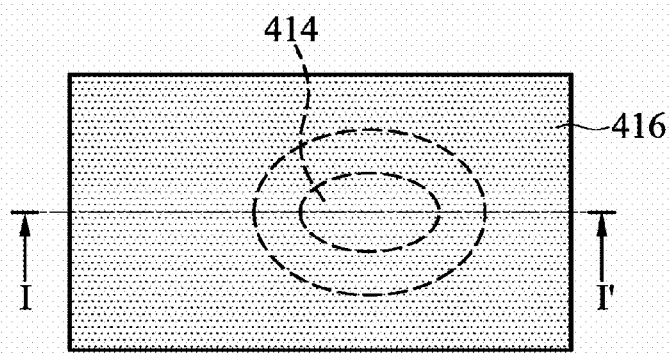
FIG. 6A shows the local plan view of the intermediate process step for forming the deep trench memory device of an embodiment of the invention.
Figure 6B:
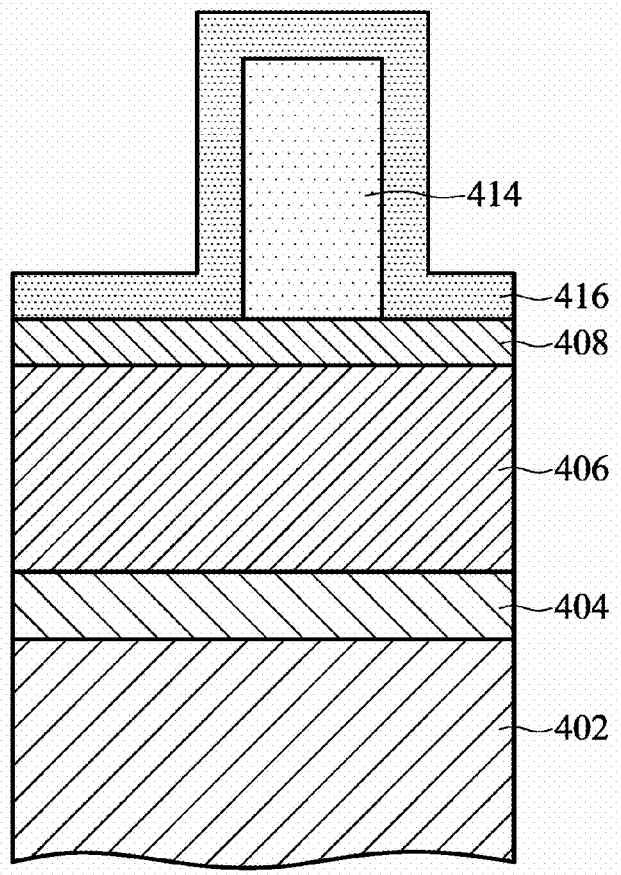
FIG. 6B shows a cross section along line I-I' of FIG. 6A.

A method for forming a deep trench memory device of an embodiment of the invention is illustrated in accordance with FIG. 4A~FIG. 23C. First, referring to FIG. 4A and FIG. 4B, wherein FIG. 4A shows the local plan view of the intermediate process step for forming the deep trench memory device of the embodiment and FIG. 4B shows a cross section along line I-I' of FIG. 4A, a substrate 402 is provided and a pad layer 404, an oxide layer 406, a carbon layer 408 and a first sacrificial layer 410 are sequentially formed on the substrate 402. In the embodiment, the substrate 402 can be a silicon substrate, the pad layer 404 can be a stack of silicon nitride layer and silicon dioxide layer, the oxide layer 406 can be $SiO_2$, BSG, PSG or BPSG, and the first sacrificial layer 410 can be silicon nitride. A first resist material is coated on the first sacrificial layer 410 and than patterned by lithography to form a resist pattern 412. Next, referring to FIG. 5A and FIG. 5B, wherein FIG. 5A shows the local plan view of the intermediate process step for forming the deep trench memory device of the embodiment and FIG. 5B shows a cross section along line I-I' of FIG. 5A, the first sacrificial layer 410 is anisotropically etched using the resist pattern 412 as a mask to form a pillar structure 414. The embodiment can fine tune parameters for the etching process to stop on the carbon layer 408. Referring to FIG. 6A and FIG. 6B, the resist pattern 412 is removed and an undoped polysilicon layer 416 is conformally deposited on the pillar structure 414 and the carbon layer 408 by a low pressure chemical vapor deposition (LPCVD) process.

Figure 7A:
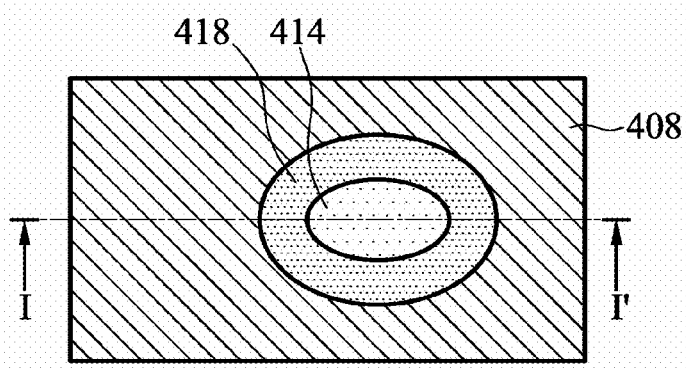
FIG. 7A shows the local plan view of the intermediate process step for forming the deep trench memory device of an embodiment of the invention.
Figure 7B:
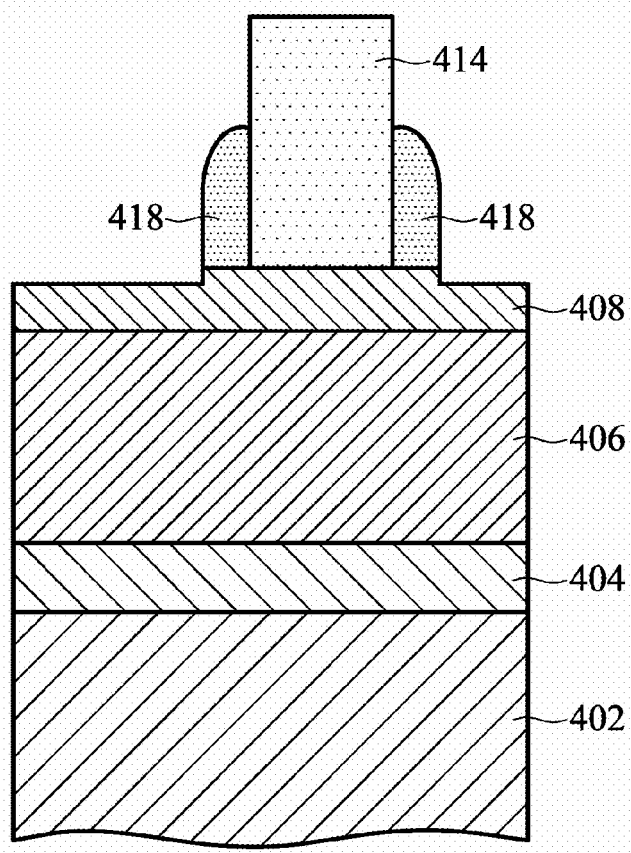
FIG. 7B shows a cross section along line I-I' of FIG. 7A.
Figure 8A:
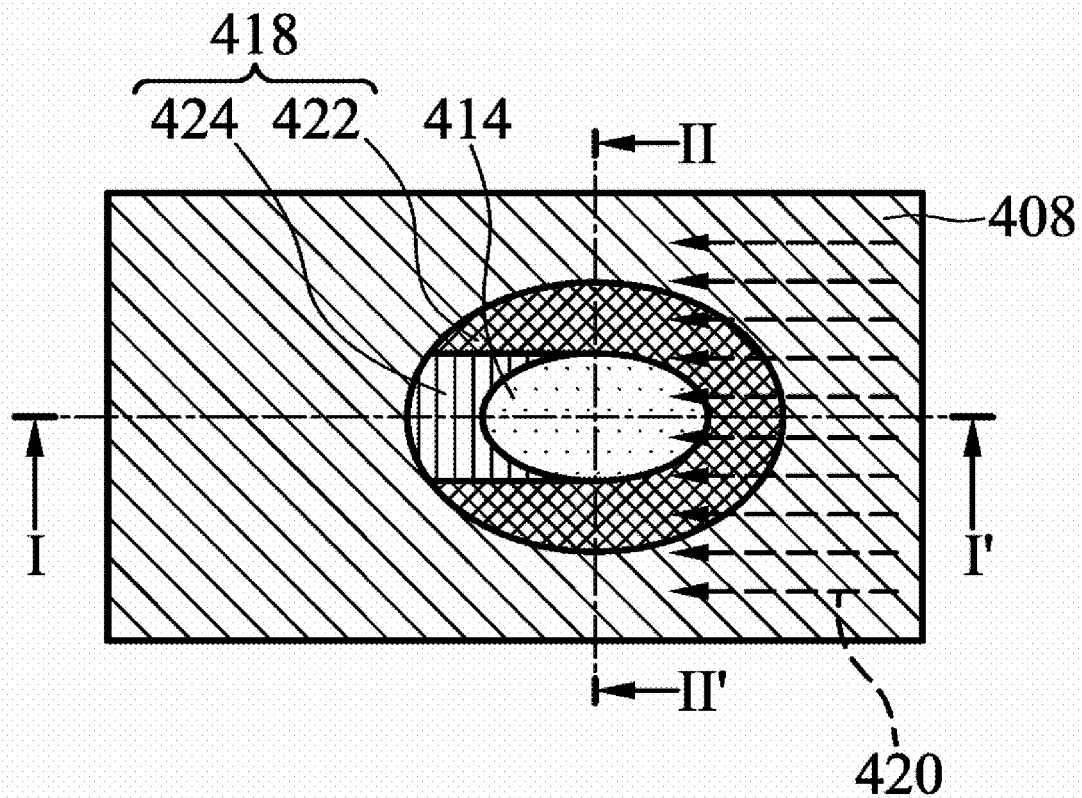
FIG. 8A shows the local plan view of the intermediate process step for forming the deep trench memory device of an embodiment of the invention.
Figure 8B:
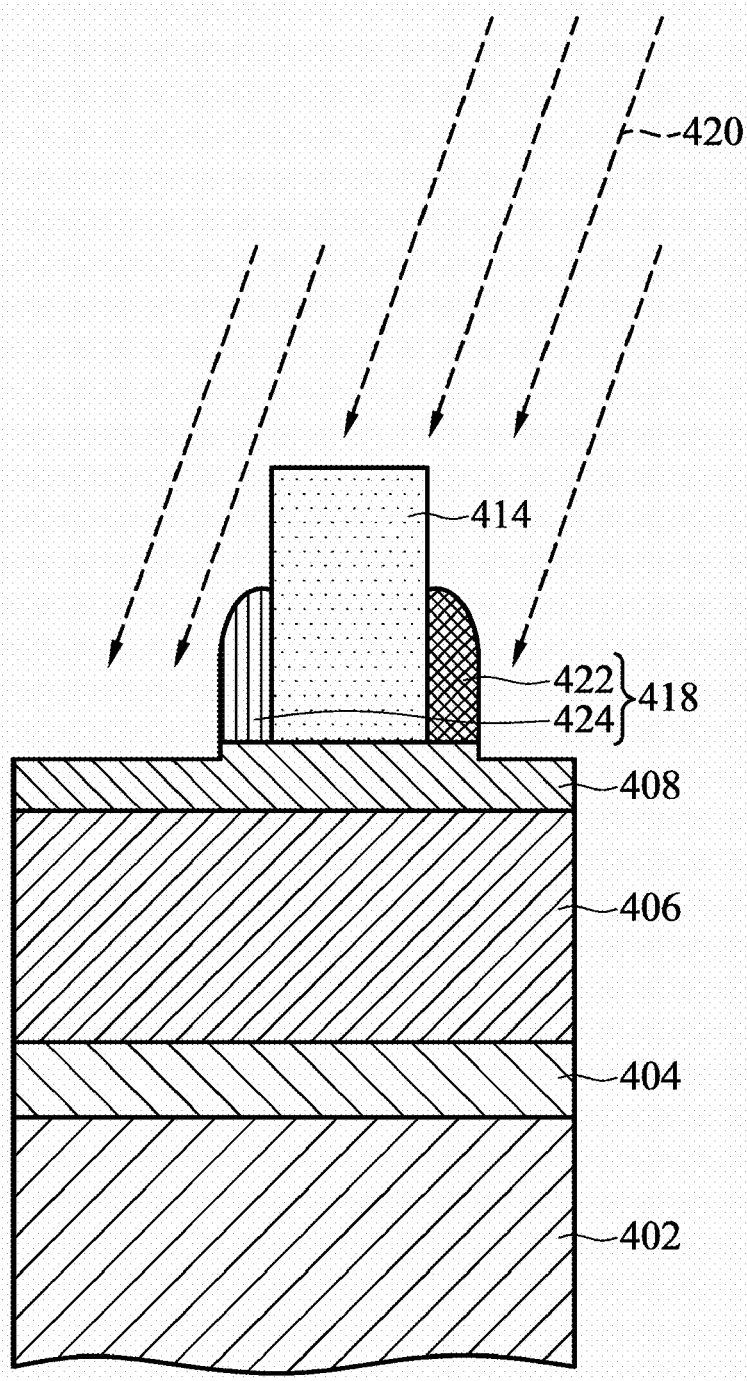
FIG. 8B shows a cross section along line I-I' of FIG. 8A.
Figure 8C:
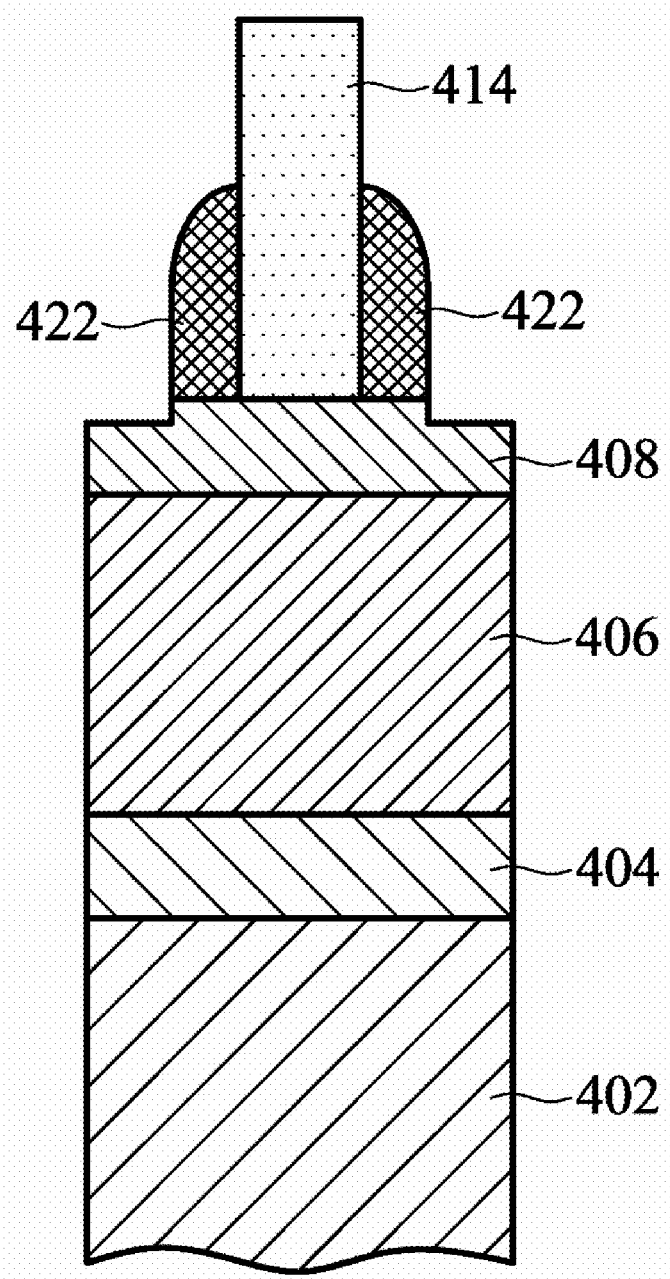
FIG. 8C shows a cross section along line II-II' of FIG. 8A.

Referring to FIG. 7A and FIG. 7B, the polysilicon layer 416 is anisotropically etched to form a ring-shaped spacer 418 surrounding the pillar structure 414. Referring to FIG. 8A, FIG. 8B and FIG. 8C, wherein FIG. 8A shows the local plan view of the intermediate process step for forming the deep trench memory device of the embodiment, FIG. 8B shows a cross section along line I-I' of FIG. 8A, and FIG. 8C shows a cross section along line II-II' of FIG. 8A, an implant process 420 with a tilt implanting angle is performed by dope $BF_2$ into the ring-shaped spacer 418, wherein a portion of the ring-shaped spacer 418 is not doped because some dopants are interrupted by the pillar structure 414. Therefore, as shown in FIGS. 8A~8C, the ring-shaped spacer 418 comprises a C-shaped doped portion 422 and an undoped portion 424.

Figure 9A:
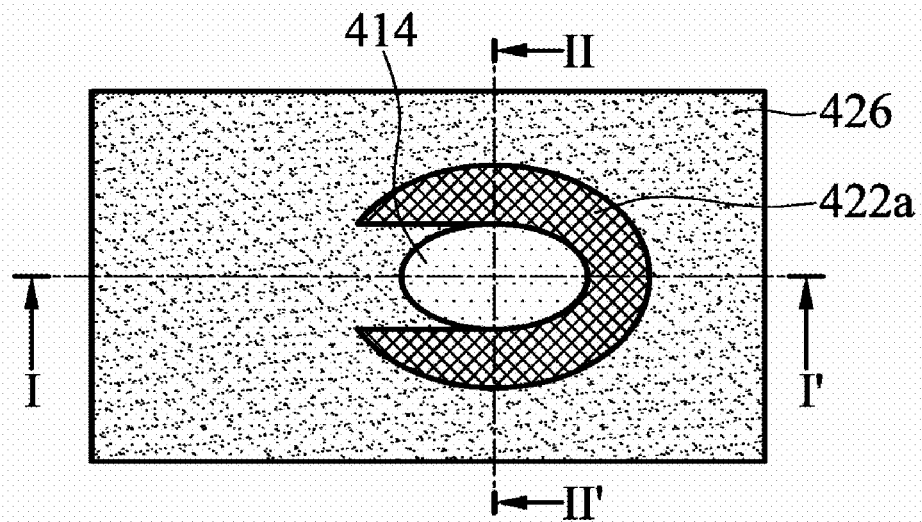
FIG. 9A shows the local plan view of the intermediate process step for forming the deep trench memory device of an embodiment of the invention.
Figure 9B:
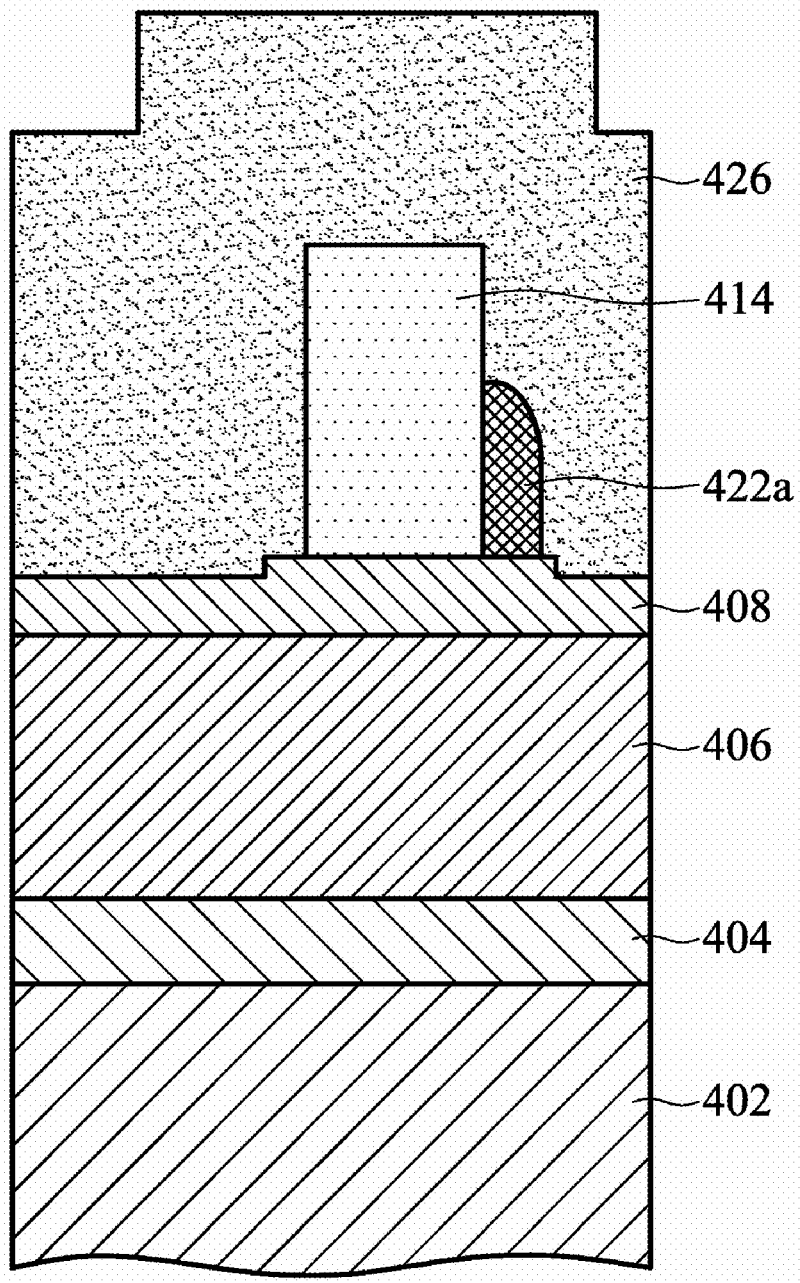
FIG. 9B shows a cross section along line I-I' of FIG. 9A.
Figure 9C:
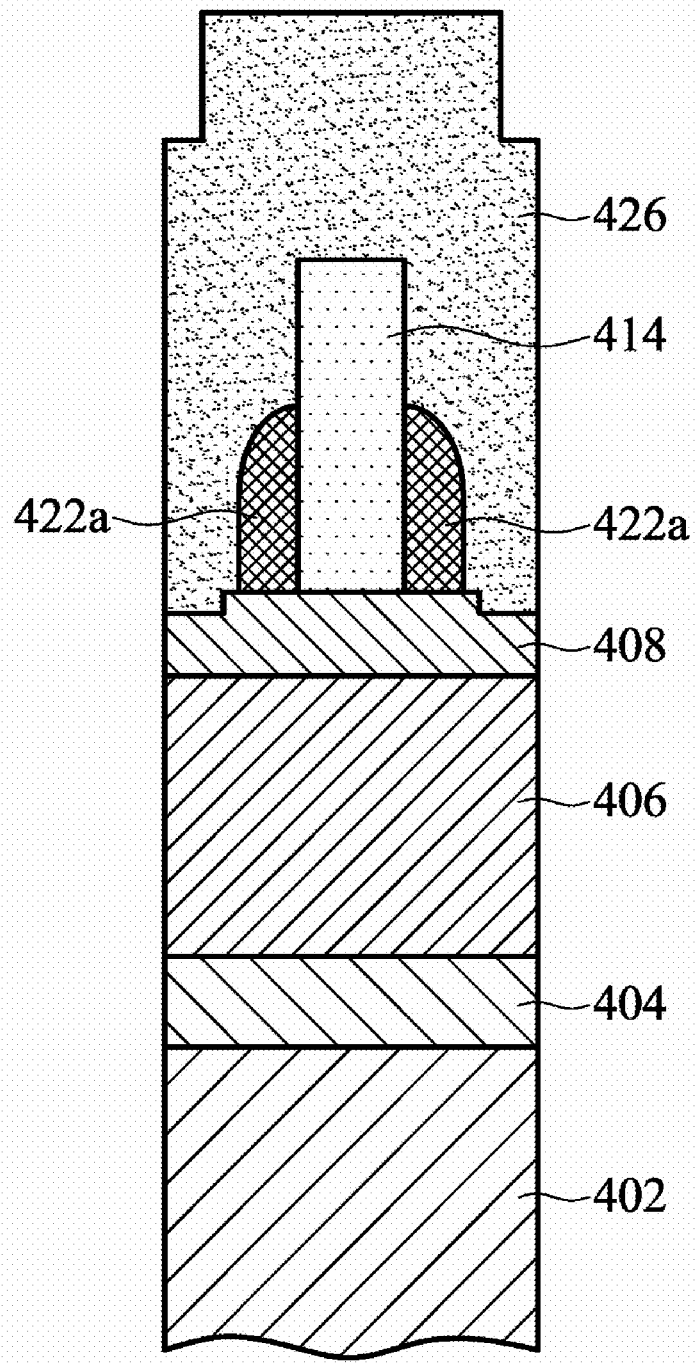
FIG. 9C shows a cross section along line II-II' of FIG. 9A.

Referring to FIG. 9A, FIG. 9B and FIG. 9C, wherein FIG. 9A shows the local plan view of the intermediate process step for forming the deep trench memory device of the embodiment, FIG. 9B shows a cross section along line I-I' of FIG. 9A, and FIG. 9C shows a cross section along line II-II' of FIG. 9A, an etching process using $NH_4OH$ as a primary etchant is performed. It is noted that the step of doping polysilicon with $BF_2$ above decreases etching rate of $NH_4OH$. Therefore, the etching process can selectively remove the undoped portion 424 of the ring-shaped spacer 418, while leaving the doped C-shaped doping portion to form a C-shaped spacer 422a. Next, a second sacrificial layer 426, such as silicon nitride, is blanketly deposited to cover the pillar structure 414 and the C-shaped spacer 422a.

Figure 10A:
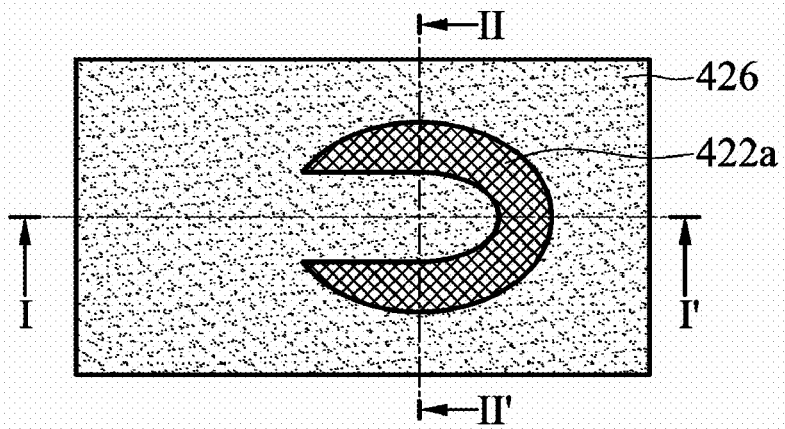
FIG. 10A shows the local plan view of the intermediate process step for forming the deep trench memory device of an embodiment of the invention.
Figure 10B:
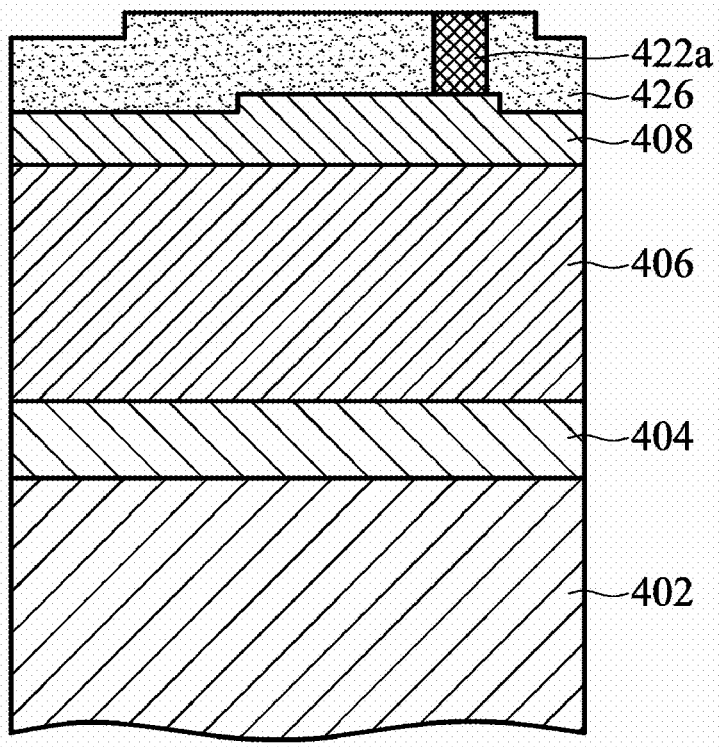
FIG. 10B shows a cross section along line I-I' of FIG. 10A.
Figure 10C:
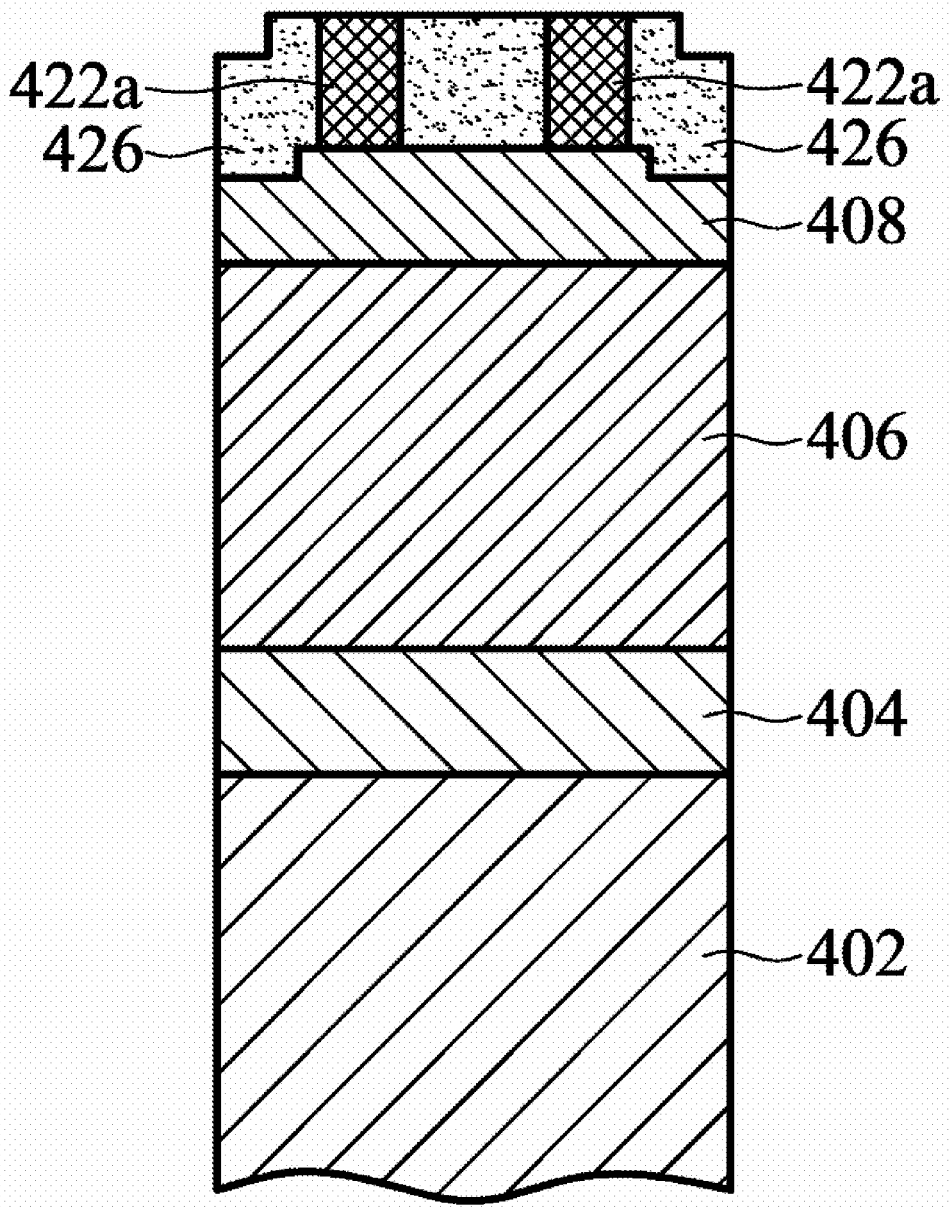
FIG. 10C shows a cross section along line II-II' of FIG. 10A.
Figure 11A:
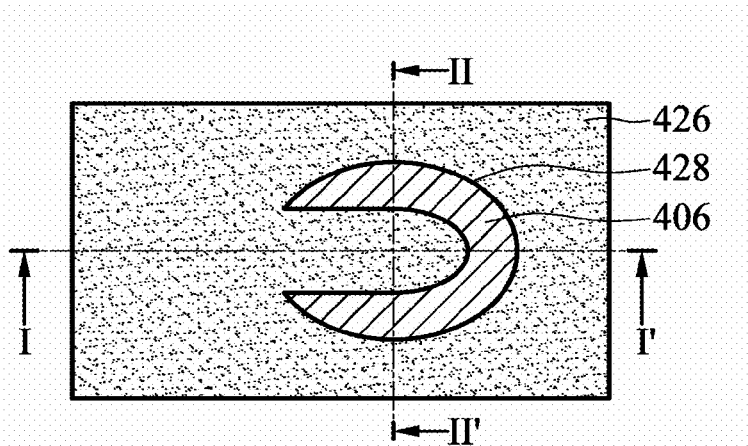
FIG. 11A shows the local plan view of the intermediate process step for forming the deep trench memory device of an embodiment of the invention.
Figure 11B:
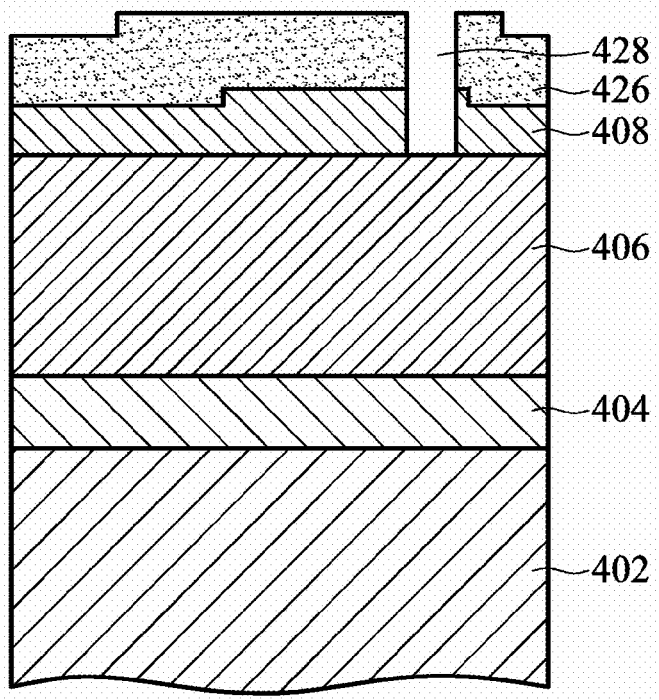
FIG. 11B shows a cross section along line I-I' of FIG. 11A.
Figure 11C:
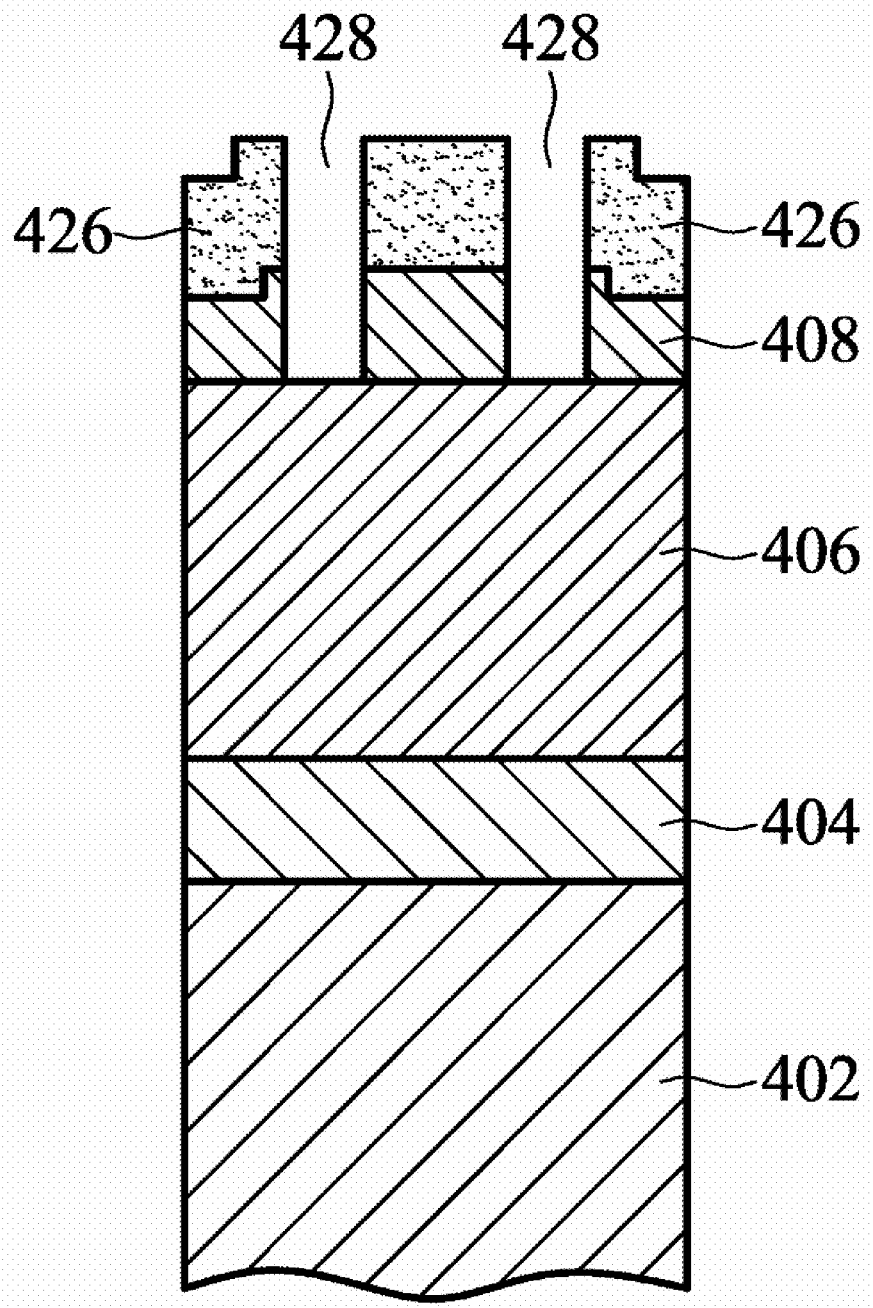
FIG. 11C shows a cross section along line II-II' of FIG. 11A.
Figure 12A:
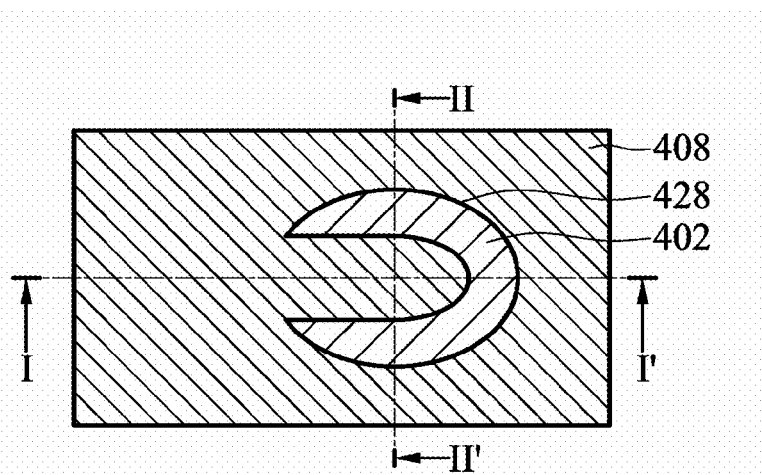
FIG. 12A shows the local plan view of the intermediate process step for forming the deep trench memory device of an embodiment of the invention.
Figure 12B:
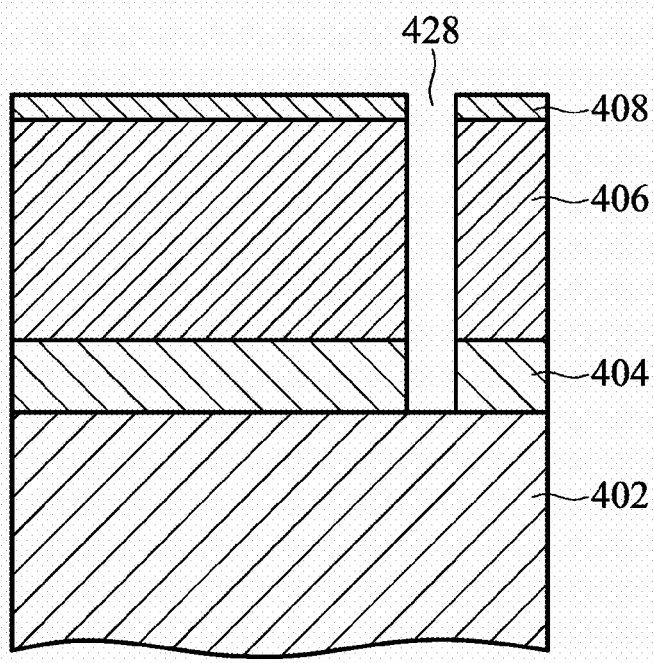
FIG. 12B shows a cross section along line I-I' of FIG. 12A.
Figure 12C:
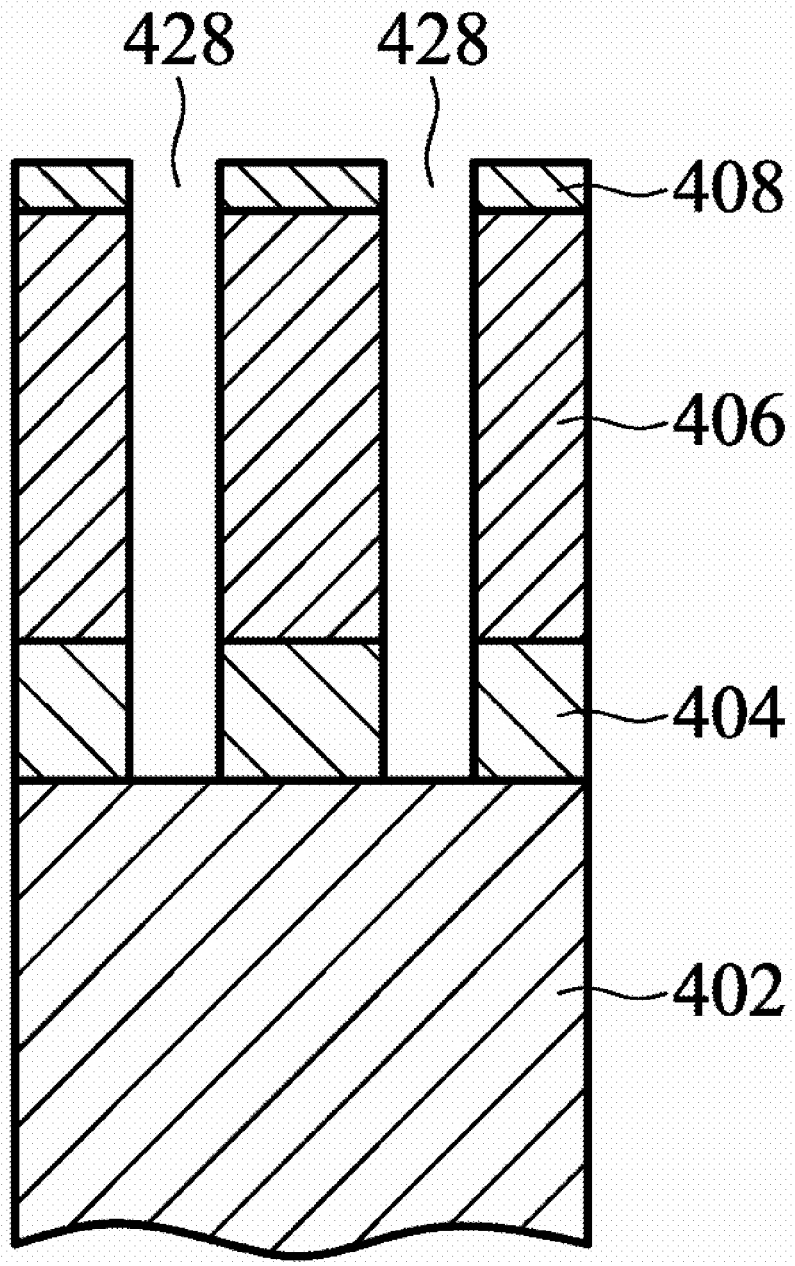
FIG. 12C shows a cross section along line II-II' of FIG. 12A.
Figure 13A:
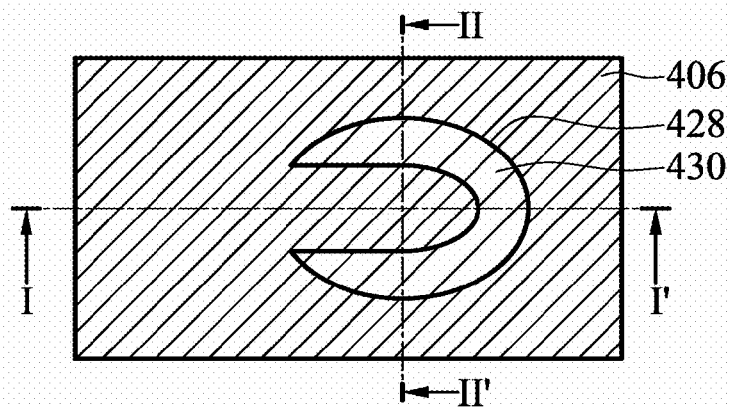
FIG. 13A shows the local plan view of the intermediate process step for forming the deep trench memory device of an embodiment of the invention.
Figure 13B:
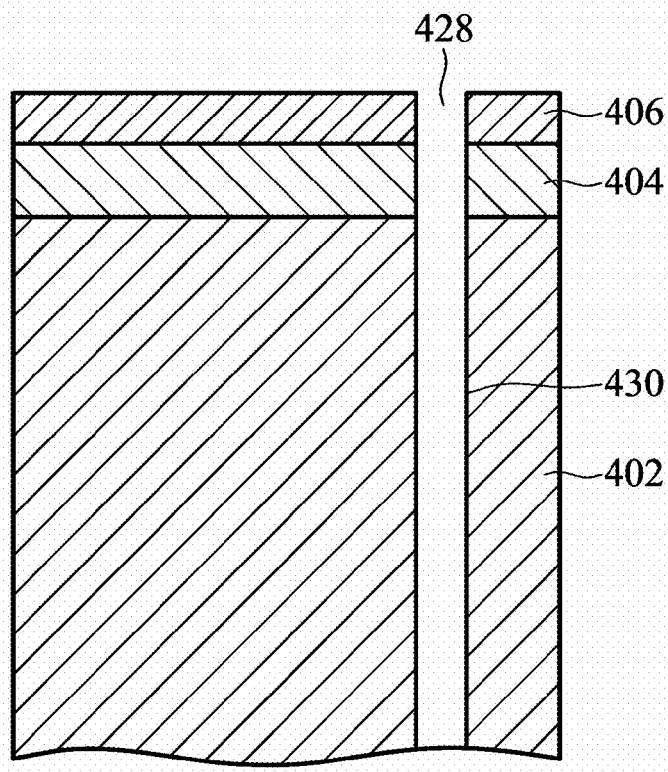
FIG. 13B shows a cross section along line I-I' of FIG. 13A.
Figure 13C:
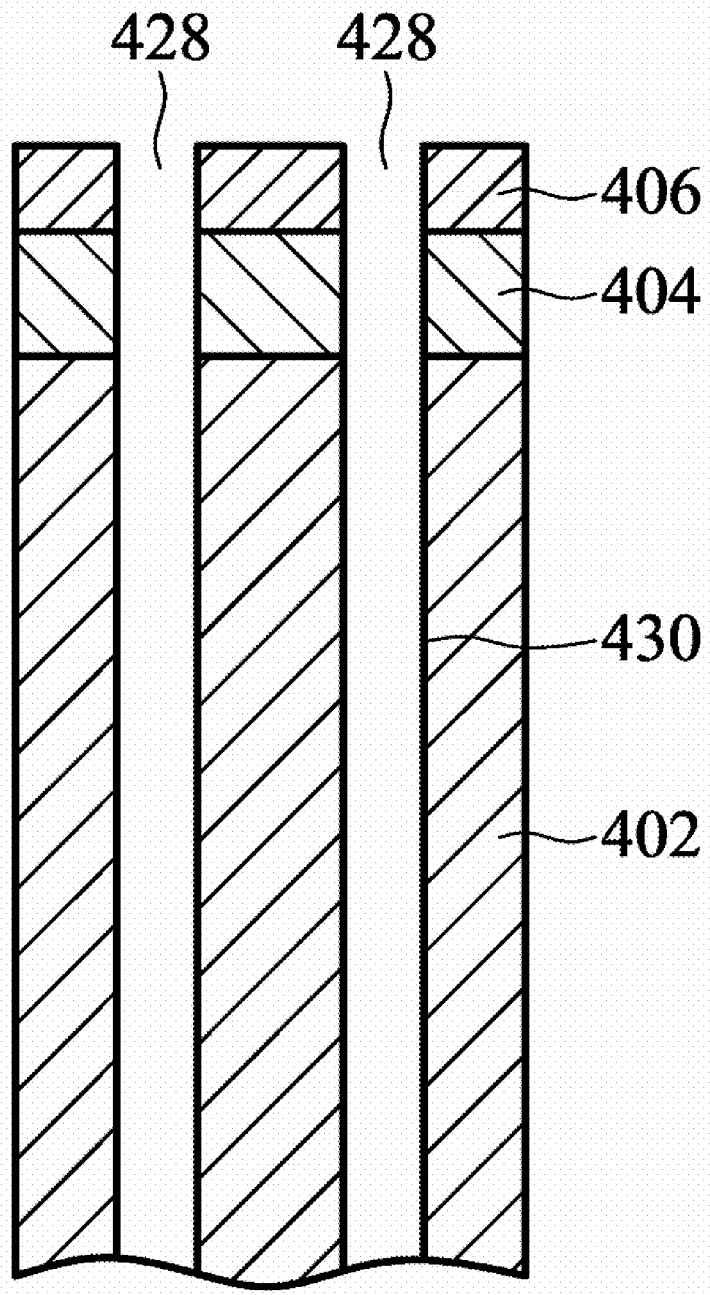
FIG. 13C shows a cross section along line II-II' of FIG. 13A.
Figure 14A:
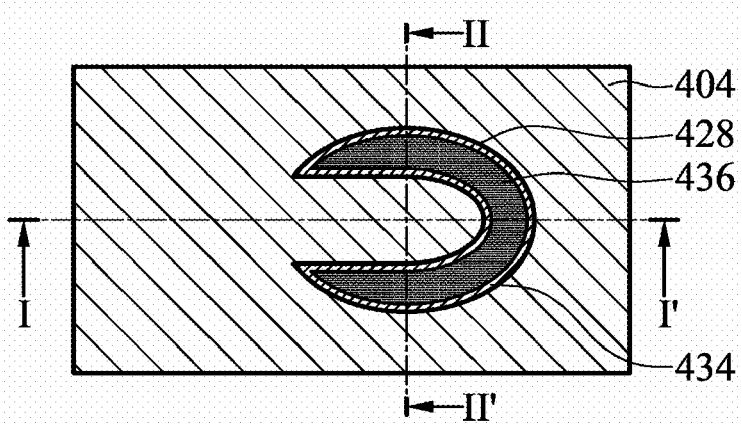
FIG. 14A shows the local plan view of the intermediate process step for forming the deep trench memory device of an embodiment of the invention.
Figure 14B:
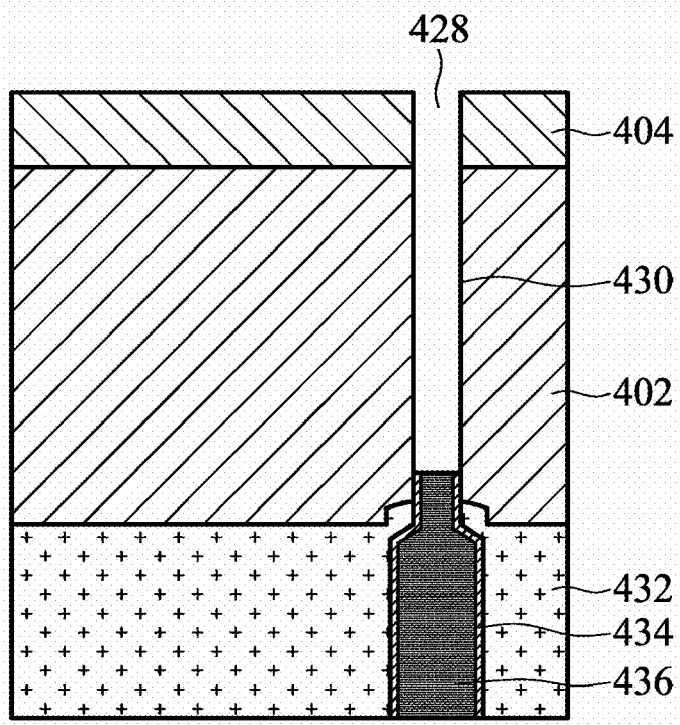
FIG. 14B shows a cross section along line I-I' of FIG. 14A.
Figure 14C:
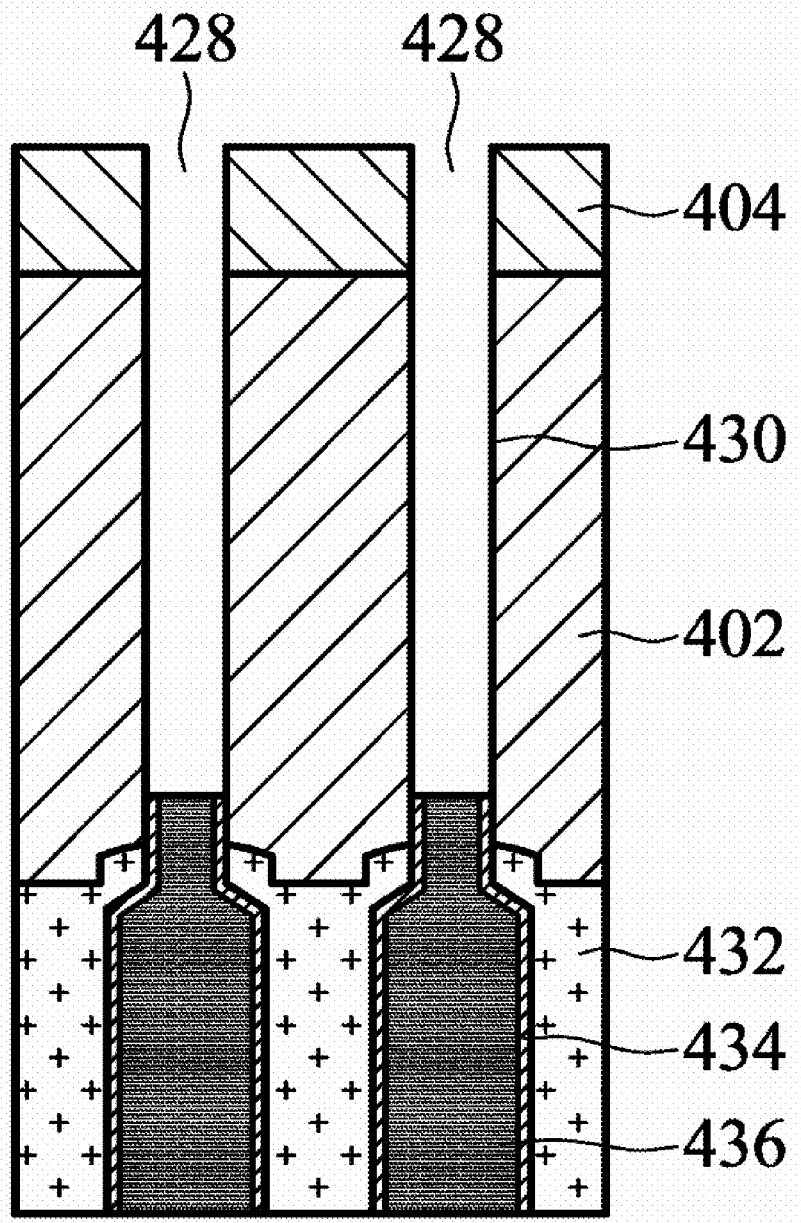
FIG. 14C shows a cross section along line II-II' of FIG. 14A.

Referring to FIG. 10A, FIG. 10B and FIG. 10C, wherein FIG. 10A shows the local plan view of the intermediate process step for forming the deep trench memory device of the embodiment, FIG. 10B shows a cross section along line I-I' of FIG. 10A, and FIG. 10C shows a cross section along line II-II' of FIG. 10A, a chemical mechanical polishing (CMP) process or an etching back process is performed till the C-shaped spacer 422a is exposed. Referring to FIG. 11A, FIG. 11B and FIG. 11C, an etching process with $NH_4OH$ is performed for a longer duration to remove the C-shaped spacer 422a formed of polysilicon and thus a C-shaped opening 428 in the second sacrificial layer 426 is formed. The carbon layer 408 is further etched using the second sacrificial layer 426 as a mask to transfer the pattern of the C-shaped opening 428 to the carbon layer 408. Referring to FIG. 12A, FIG. 12B and FIG. 12C, the second sacrificial layer 426 is removed and the silicon glass layer 406 and the pad layer 404 are etched using the carbon layer 408 as a mask to transfer the pattern of the C-shaped opening 428 to the oxide layer 406 and the pad layer 404. Referring to FIG. 13A, FIG. 13B and FIG. 13C, the substrate 402 is etched to form a C-shaped deep trench 430 using the carbon layer 408, the oxide layer 406 and the pad layer 404 as a hard mask, wherein the carbon layer 408 may be consumed during the etching process. Referring to FIG. 14A, FIG. 14B and FIG. 14C, the oxide layer 406 is removed, a portion of the substrate 402 is doped to form a doping region 432 as a first electrode of a capacitor, and the capacitor 434 is formed on the sidewall of the lower portion of the C-shaped deep trench 430. A first polysilicon layer 436 is filled into the lower portion of the C-shaped deep trench capacitor to electrically connect the second electrode of the capacitor 434.

Figure 15A:
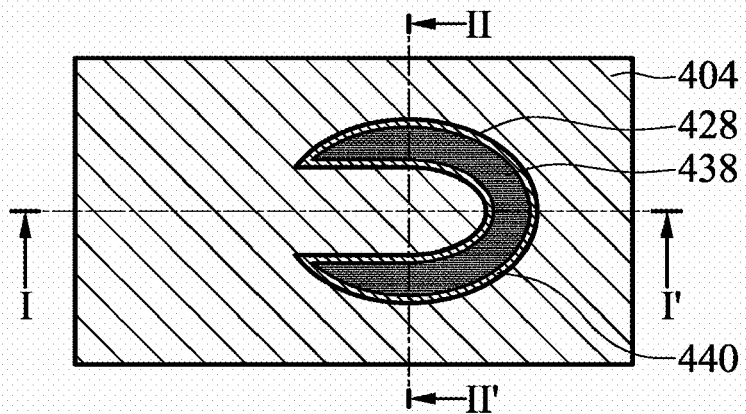
FIG. 15A shows the local plan view of the intermediate process step for forming the deep trench memory device of an embodiment of the invention.
Figure 15B:
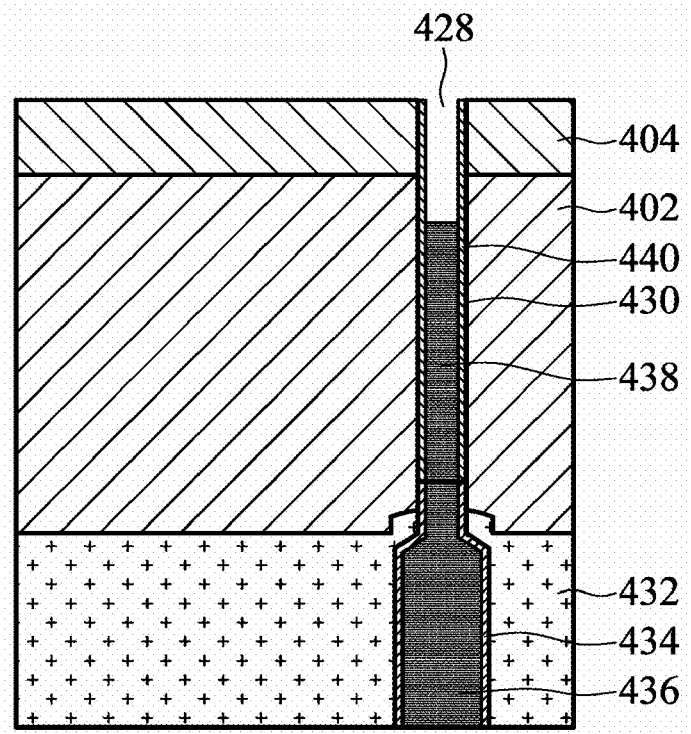
FIG. 15B shows a cross section along line I-I' of FIG. 15A.
Figure 15C:
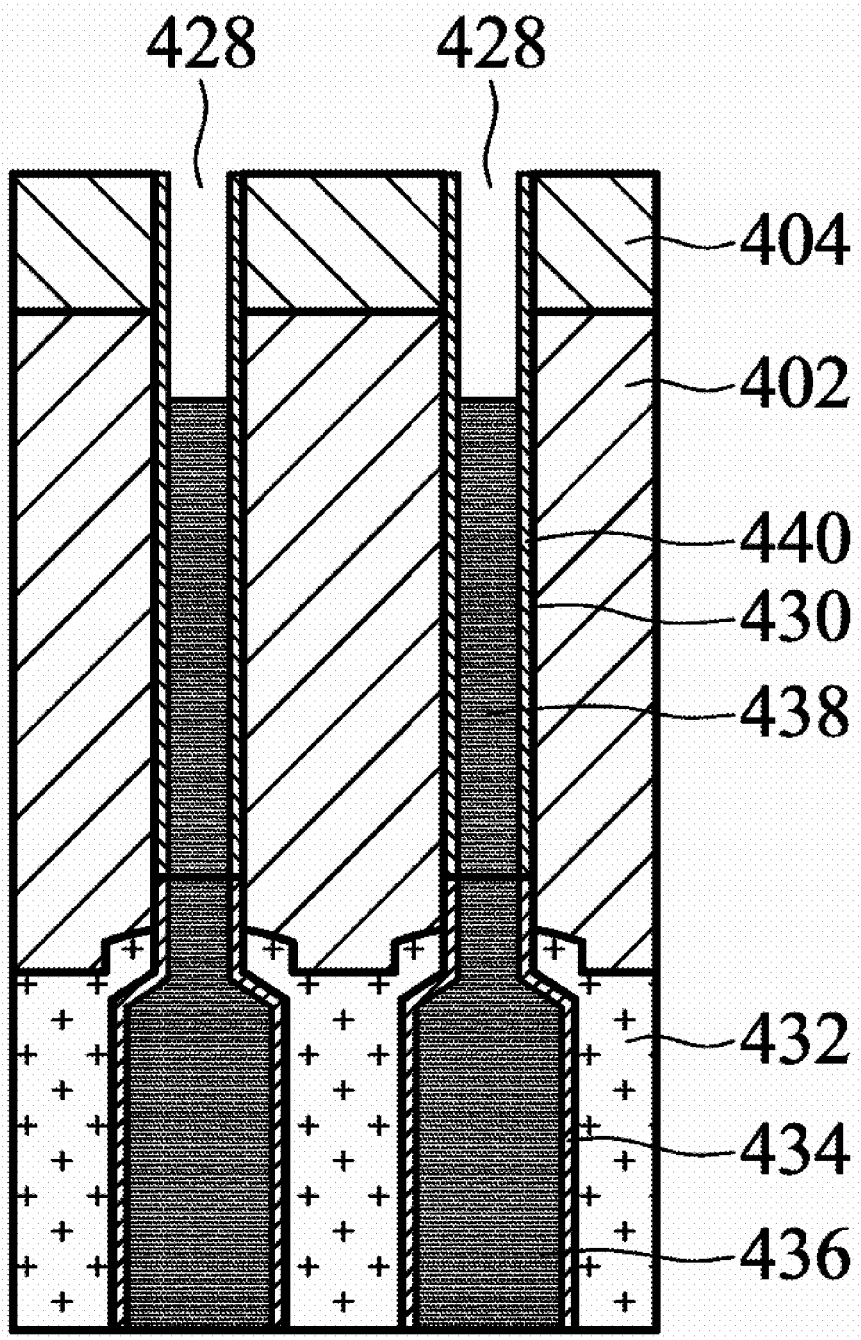
FIG. 15C shows a cross section along line II-II' of FIG. 15A.
Figure 16A:
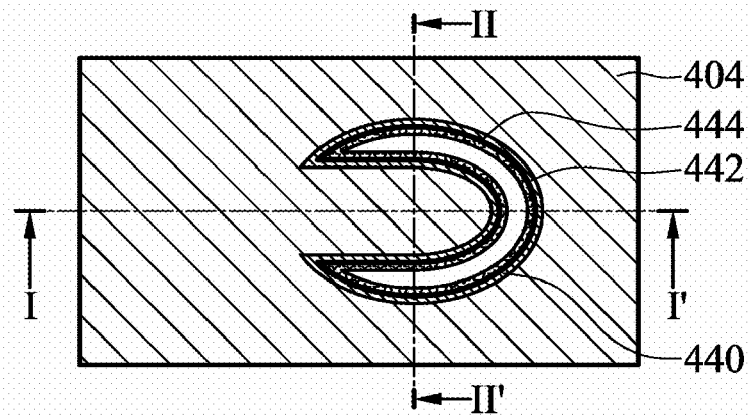
FIG. 16A shows the local plan view of the intermediate process step for forming the deep trench memory device of an embodiment of the invention.
Figure 16B:
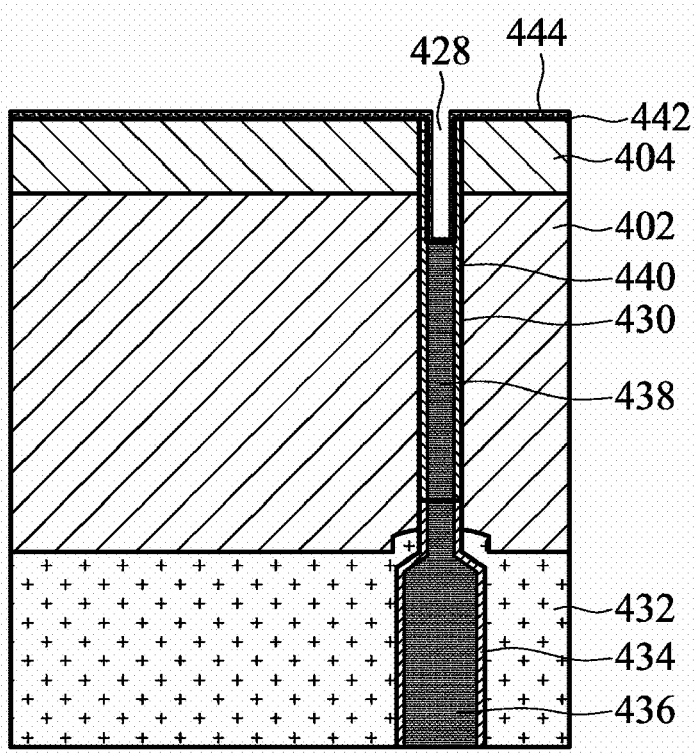
FIG. 16B shows a cross section along line I-I' of FIG. 16A.
Figure 16C:
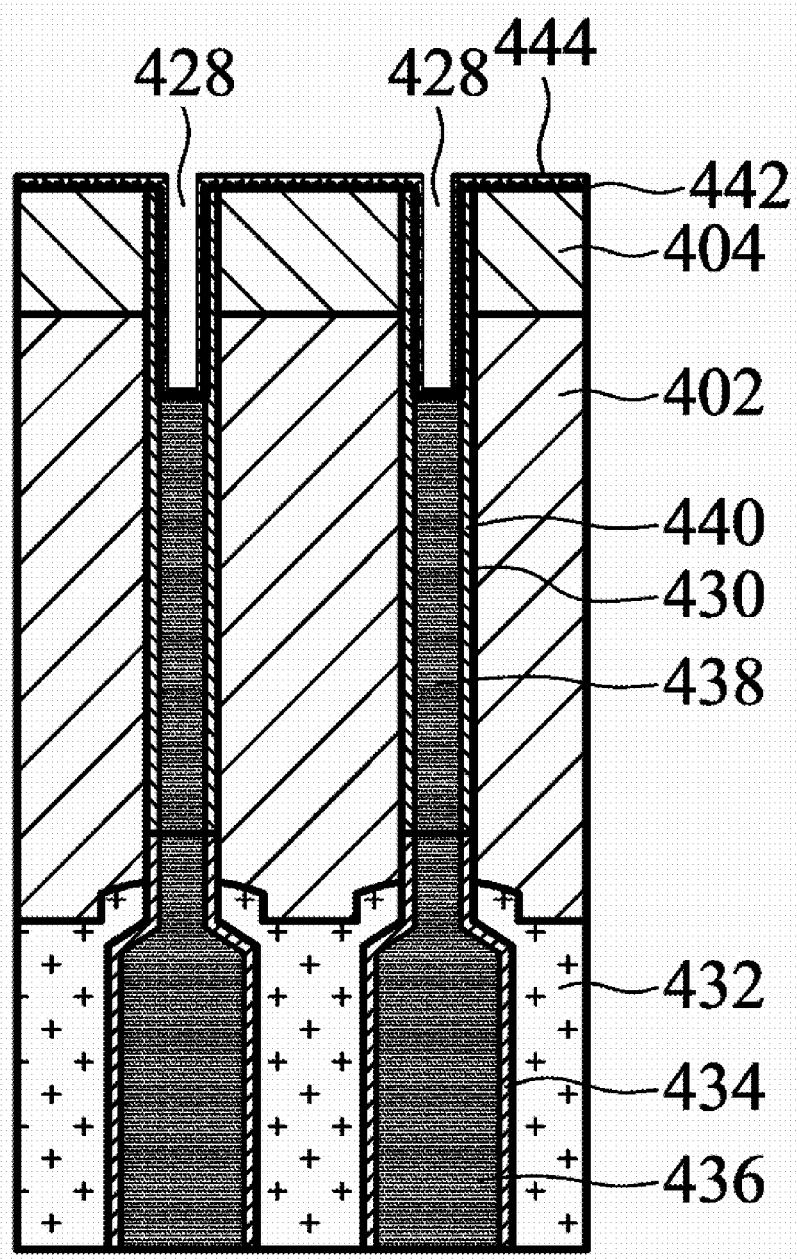
FIG. 16C shows a cross section along line II-II' of FIG. 16A.

Referring to FIG. 15A, FIG. 15B and FIG. 15C, a collar dielectric layer 440, for example comprising silicon oxide, is formed on the sidewall of the upper portion of the C-shaped deep trench 430 by an LPCVD and etching back process. Next, a second polysilicon layer 438 is formed in the C-shaped deep trench 430 by a deposition and etching back process. Referring to FIG. 16A, FIG. 16B and FIG. 16C, a liner layer 442 formed of silicon nitride is deposited in the C-shaped deep trench 430 and on the pad layer 404 and a sacrificial polysilicon layer 444 is then conformally deposited on the liner layer 442.

Figure 17:
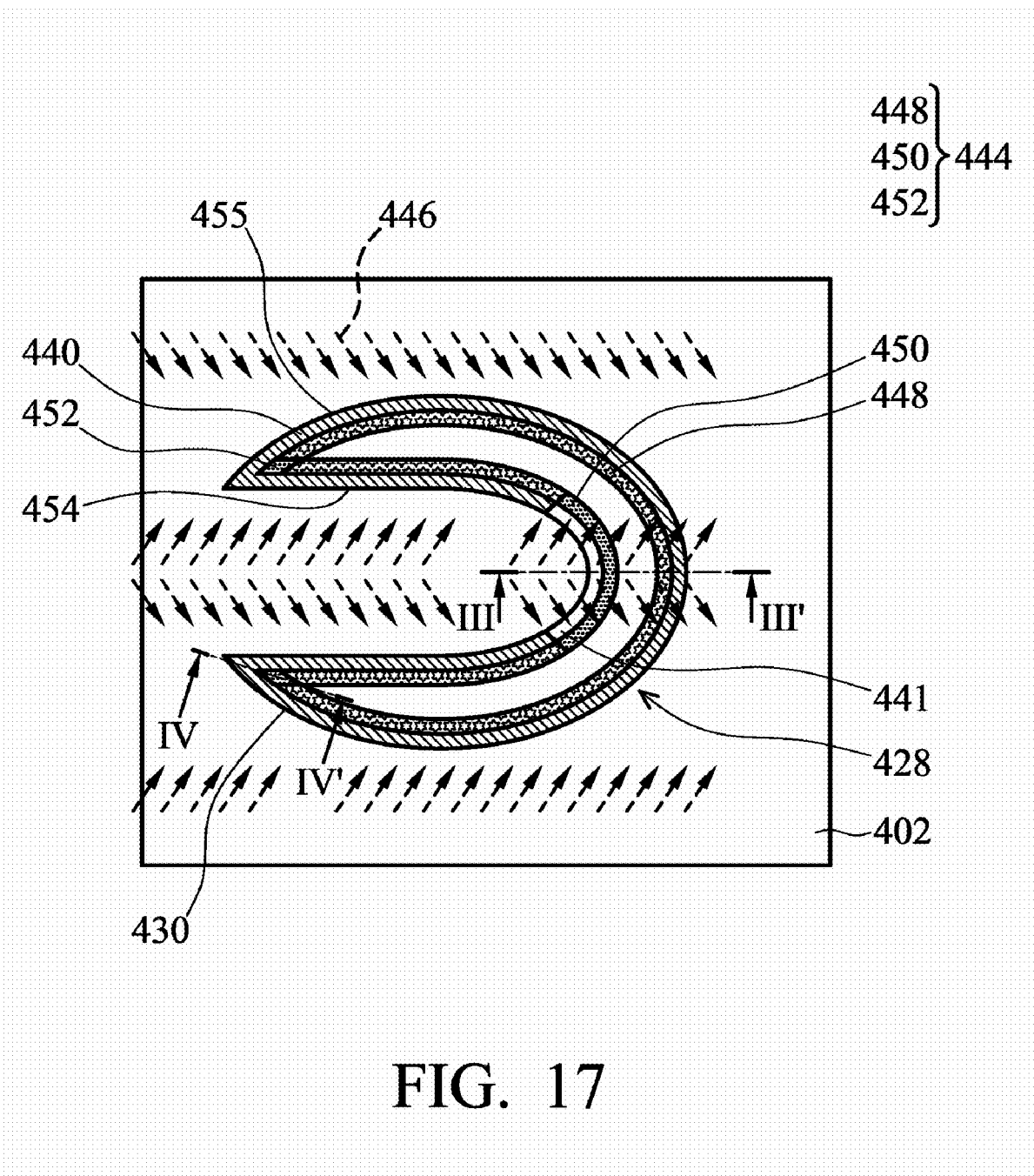
FIG. 17 shows the local plan view of the intermediate process step for forming the deep trench memory device of an embodiment of the invention.
Figure 18A:
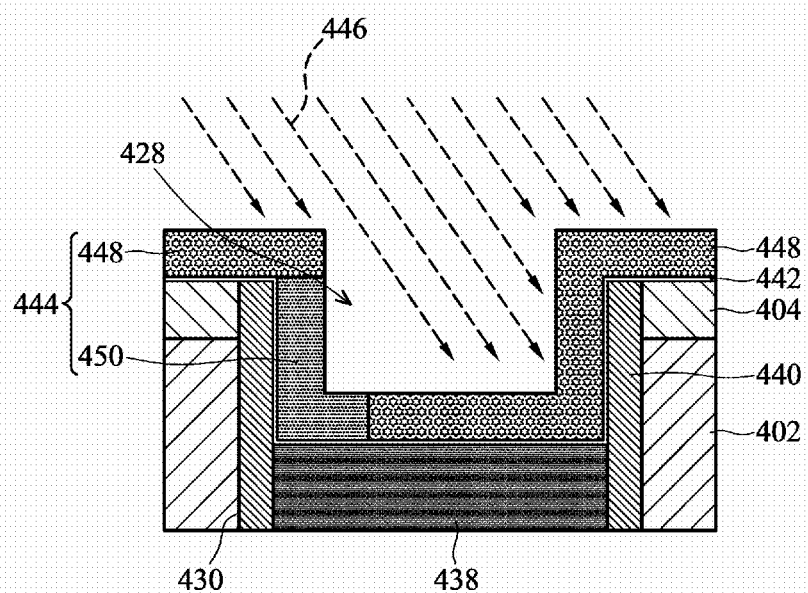
FIGS. 18A~18D shows cross sections along line III-III' of FIG. 17.
Figure 18B:
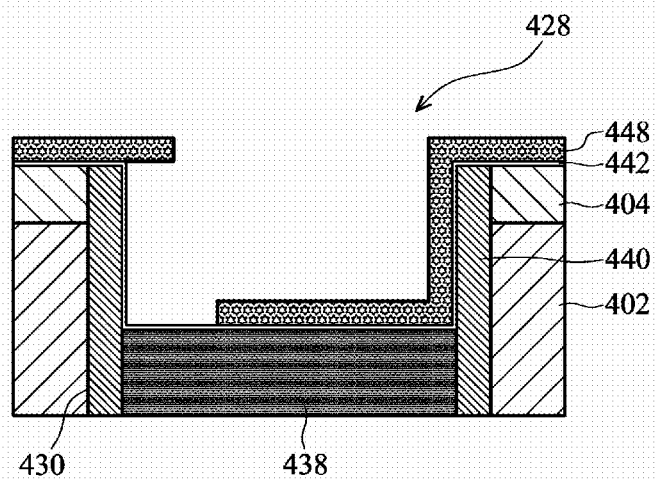
Figure 18C:
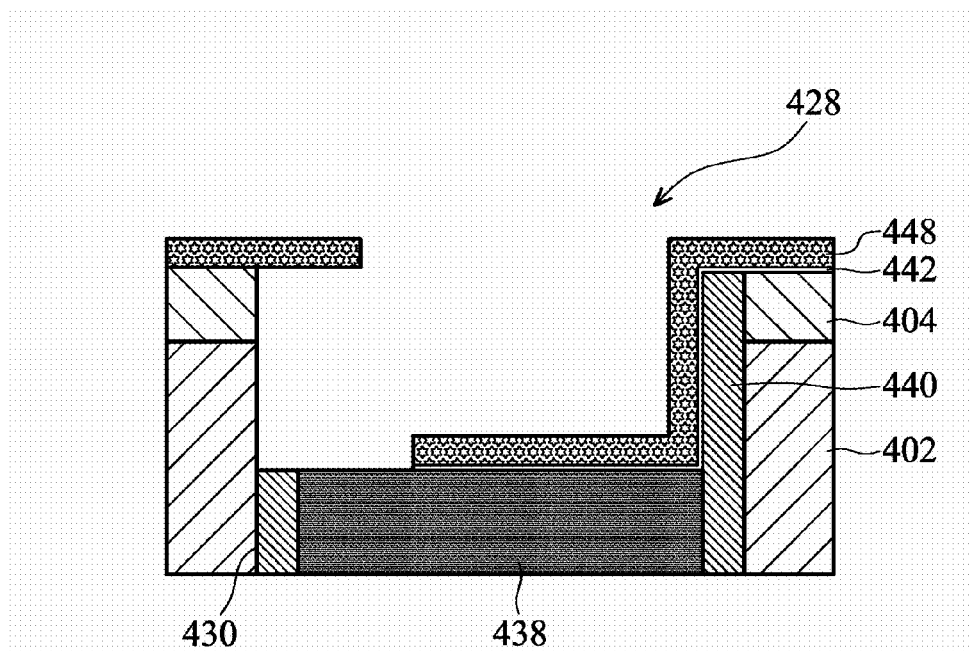
Figure 18D:
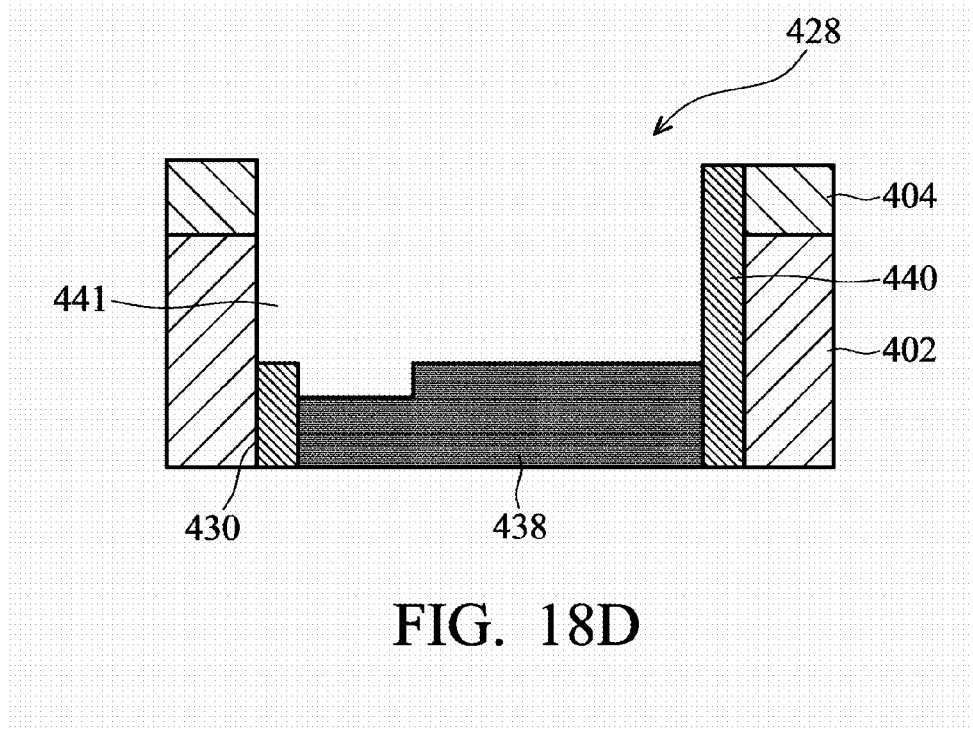

An important aspect of the embodiment of the invention is illustrated in accordance with FIG. 17, FIGS. 18A~18D and FIGS. 19A~19D, in which FIG. 17 shows the local plan view of the intermediate process step for forming the deep trench memory device of the embodiment, FIGS. 18A~18D show cross sections along line III-III' of FIG. 17, and FIGS. 19A~19D show cross sections along line IV-IV' of FIG. 17. First, referring to FIG. 17 and FIG. 18A, an implanting process 446 with a tilt-angle is performed. It is noted that the implanting process dopes $BF_2$ and implants with two different angles. The tilt-angle implanting process 446 does not dope the portion of the sacrificial polysilicon layer (the first undoped portion 450) in the C-shaped deep trench 430. The neighboring central portion of the inner edge 454 of the C-shaped opening 428 and the other portion of the sacrificial polysilicon layer are doped to form a doping portion 448. Note that etching rate of $NH_4OH$ is decreased by doping polysilicon with $BF_2$. Therefore, as shown in FIG. 18B, the first undoped portion 450 of the sacrificial polysilicon layer 444 is removed during an etching process using $NH_4OH$ as a main etchant, while leaving the doped portion 448 of the sacrificial polysilicon layer. Referring to FIG. 18C, an etching process, such as immersion of phosphoric acid, is performed to remove a portion of the liner layer 442 uncovered by the polysilicon, and another etching process, such as immersion of HF, is then performed to remove a portion of the collar dielectric layer 440 uncovered by the polysilicon. Referring to FIG. 18D, the remaining sacrificial polysilicon layer 448 and liner layer 442 are removed. Note that the object of the steps in this paragraph is to open a portion of the collar dielectric layer neighboring the central portion of the inner edge 454 of the C-shaped opening 428 to form a gap 441, while not opening the other portion of the collar dielectric layer 440.

Figure 19A:
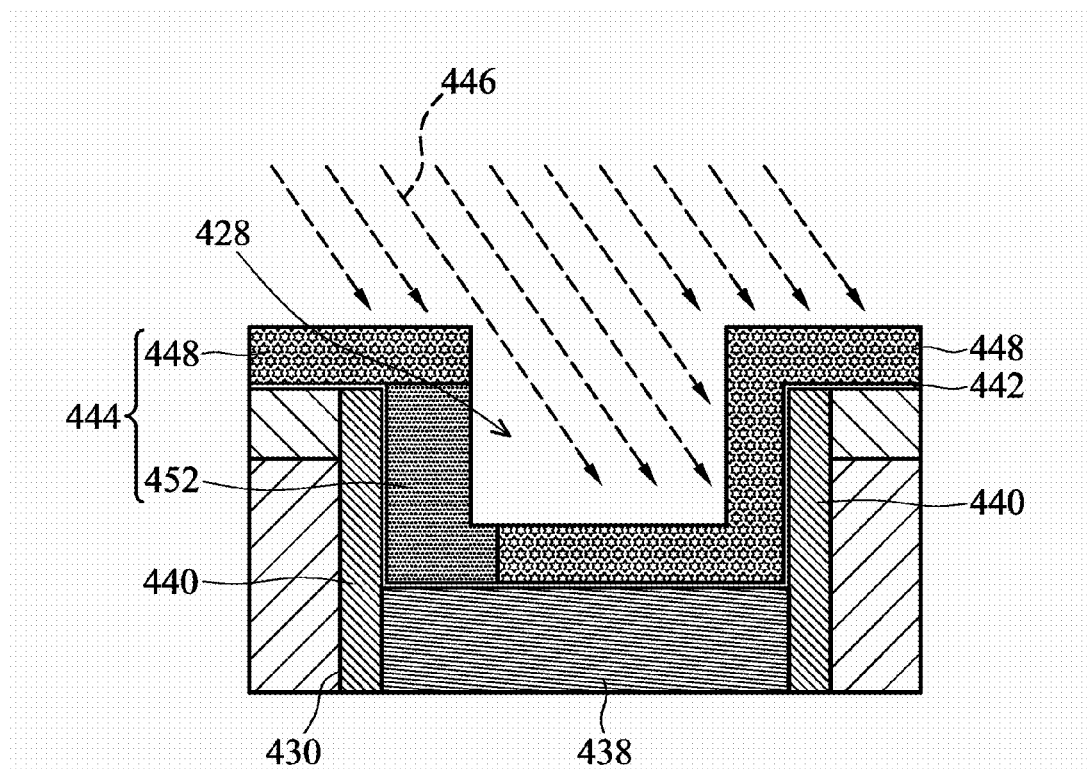
FIGS. 19A~19D shows cross sections along line IV-IV' of FIG. 17.
Figure 19B:
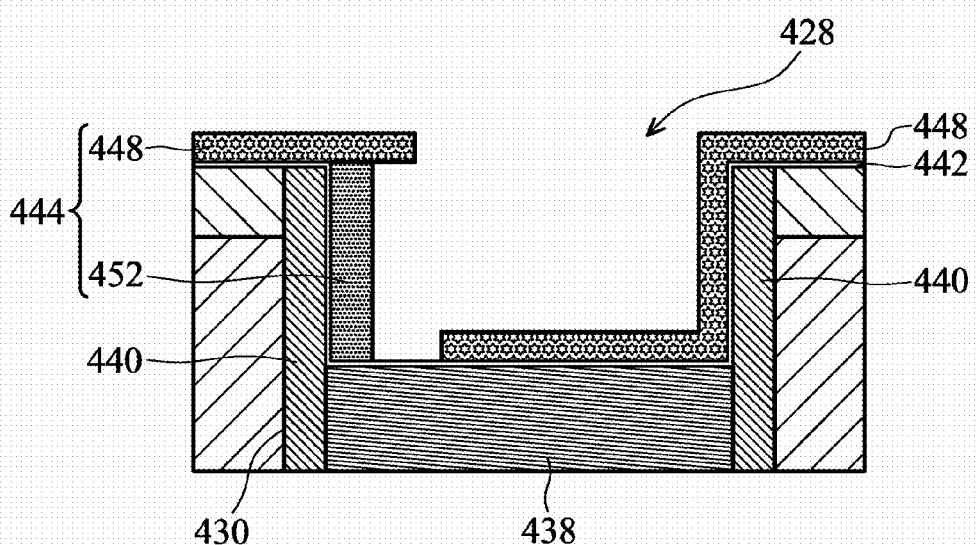
Figure 19C:
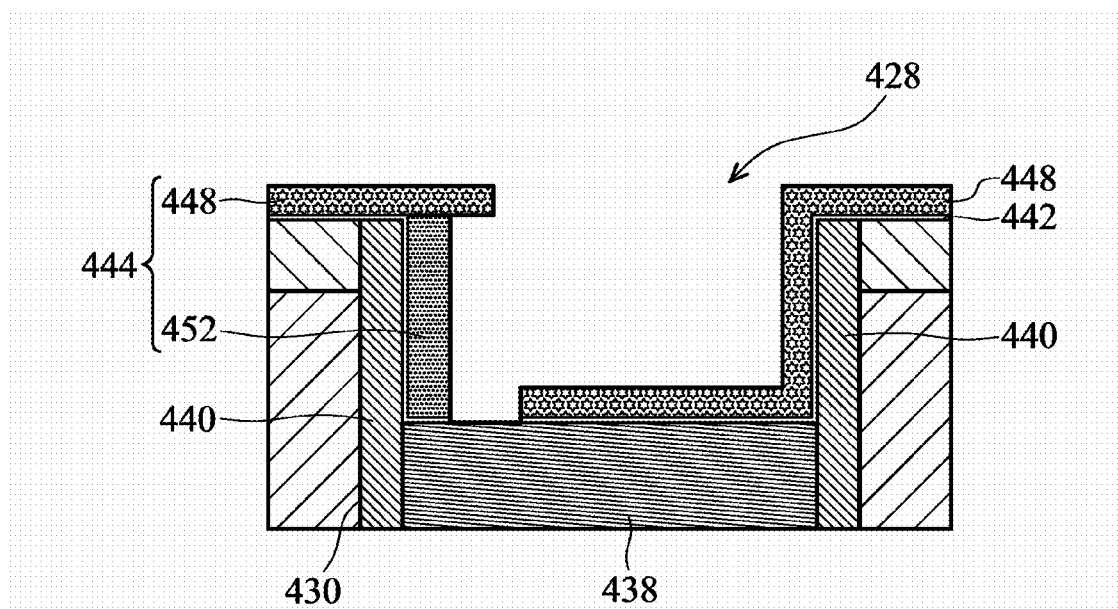
Figure 19D:
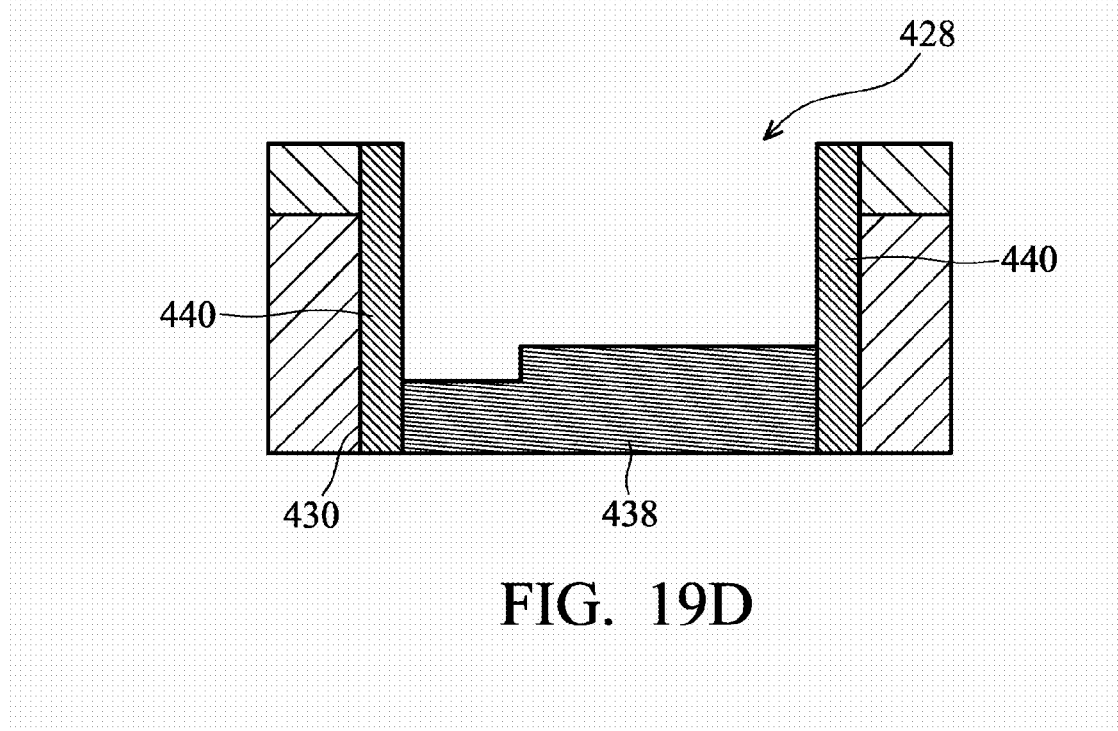

The tilt-angle implanting process 446 may dope a portion of the sacrificial polysilicon layer 452 neighboring the connecting point of the outer edge 455 and the inner edge 454 of the C-shaped opening 428. Nevertheless, the portion of the collar dielectric layer 440 neighboring the connecting point should not be opened by the etching step described above and the reason is explained in accordance with FIGS. 19A~19D. Referring to FIG. 17 and FIG. 19A, since the opening neighboring the connecting point of the outer edge 455 and the inner edge 454 of the C-shaped opening 428 has a small area, the portion 452 of the sacrificial polysilicon layer presents a thicker portion at this position, and although the second undoped portion 452 may not be doped during the tilt-angle implanting process 446, it should not be completely removed during etching process using $NH_4OH$ to remove the portion of the sacrificial polysilicon layer neighboring the central portion of the inner edge 454 of the C-shaped opening 428, as shown in FIG. 19B. Therefore, as shown in FIG. 19C, etching using immersion of HF should not open the portion of the collar dielectric layer 440 neighboring this position and the portion of the collar dielectric layer 440 should remain after removal of the sacrificial polysilicon layer 444, as shown in FIG. 19D.

Figure 20A:
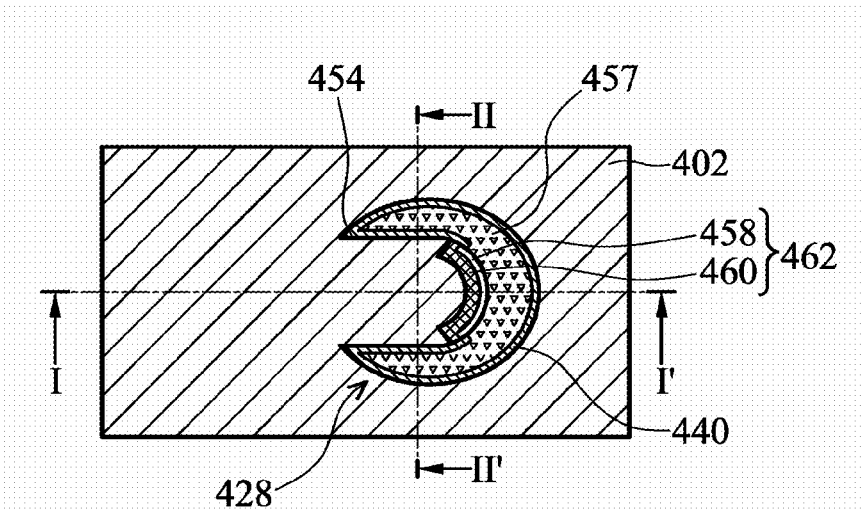
FIG. 20A shows the local plan view of the intermediate process step for forming the deep trench memory device of an embodiment of the invention.
Figure 20B:
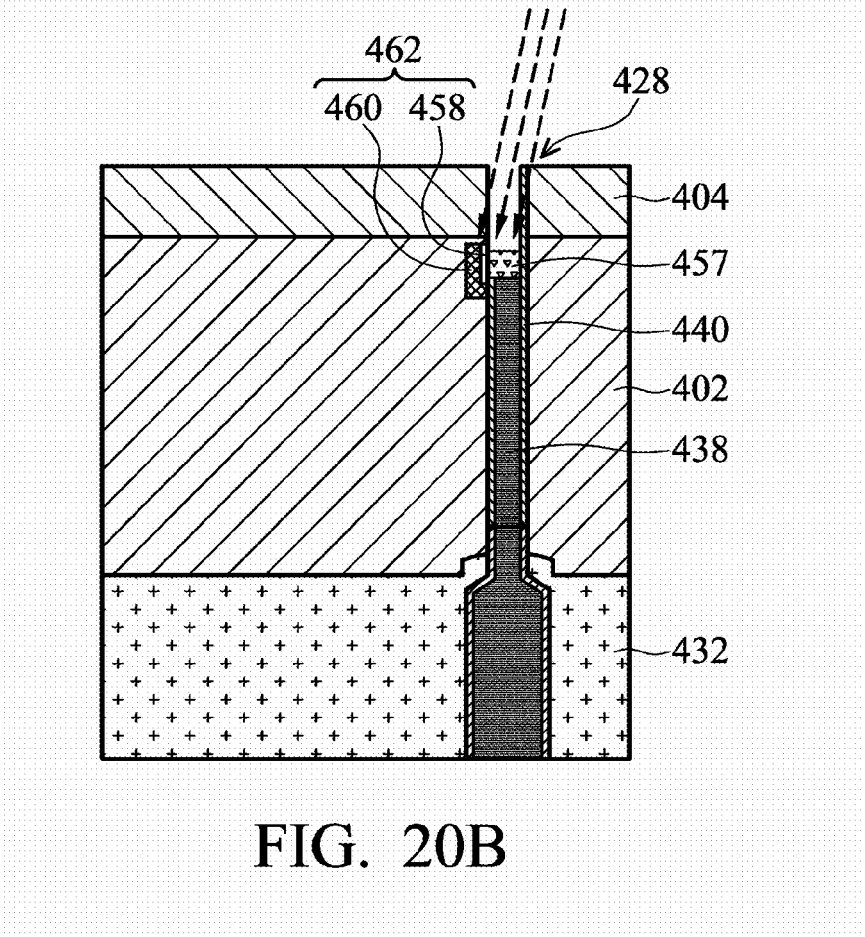
FIG. 20B shows a cross section along line I-I' of FIG. 20A.
Figure 20C:
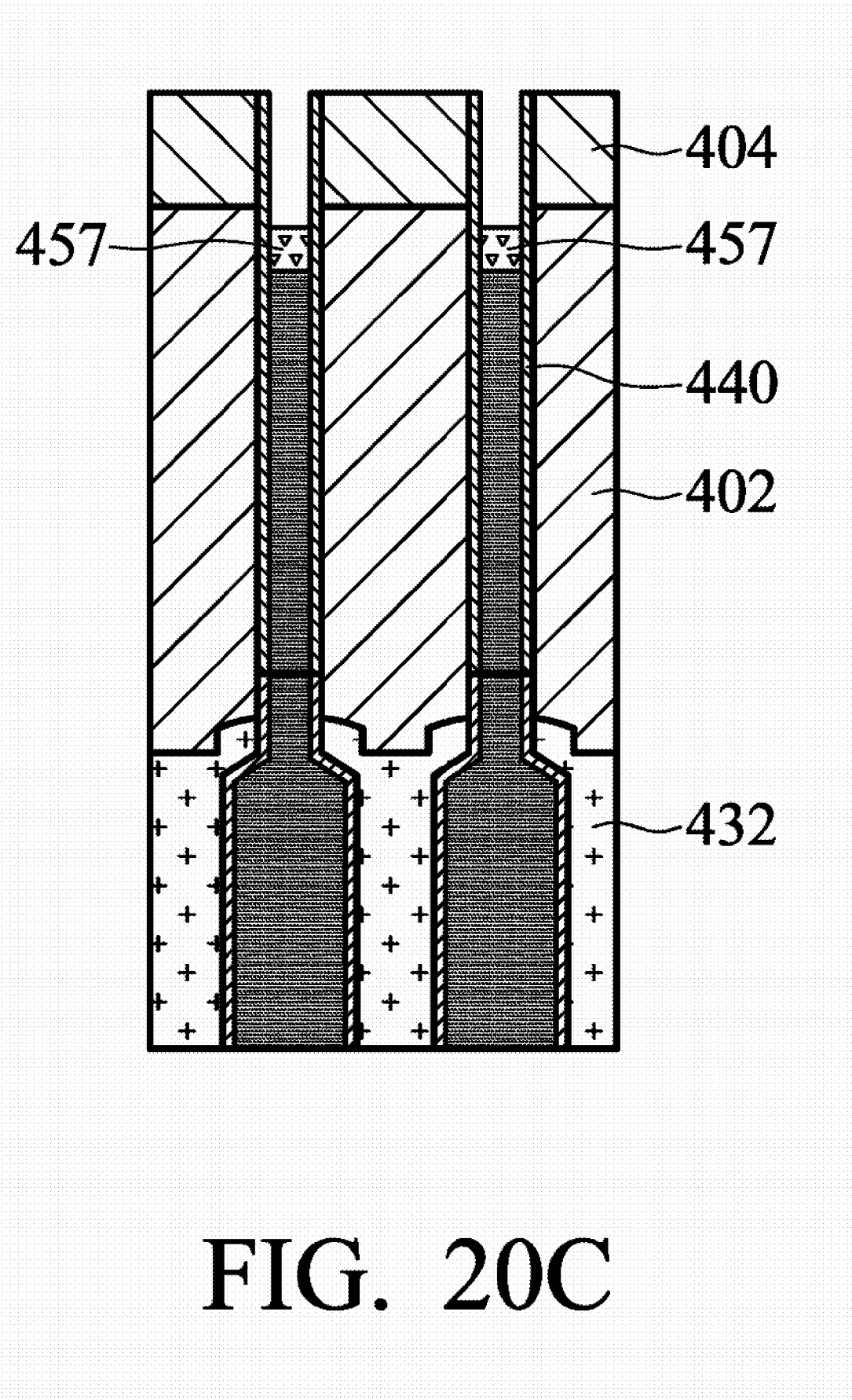
FIG. 20C shows a cross section along line II-II' of FIG. 20A.
Figure 21A:
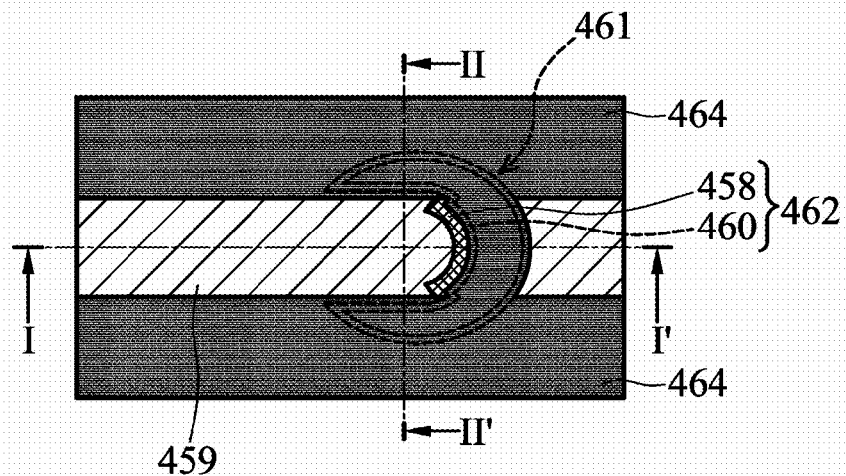
FIG. 21A shows the local plan view of the intermediate process step for forming the deep trench memory device of an embodiment of the invention.
Figure 21B:
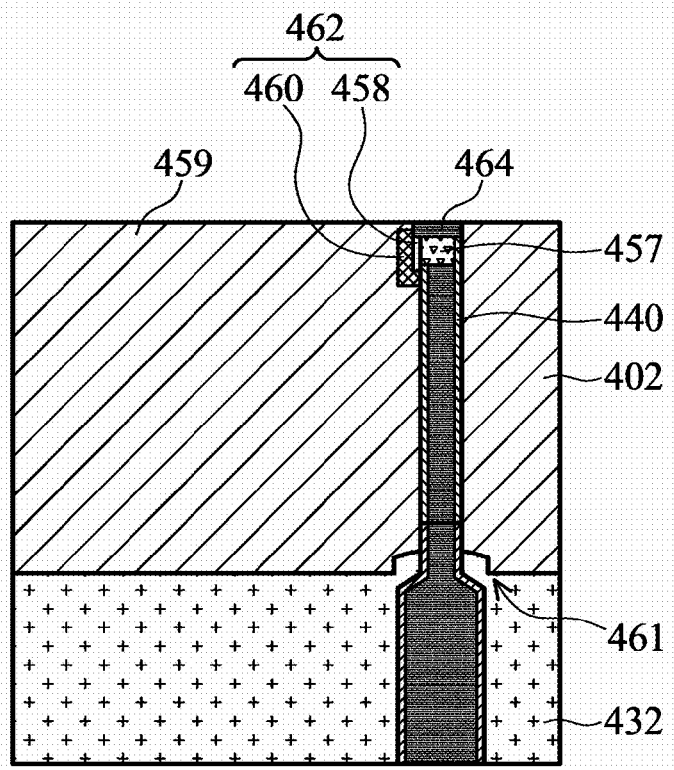
FIG. 21B shows a cross section along line I-I' of FIG. 21A.
Figure 21C:
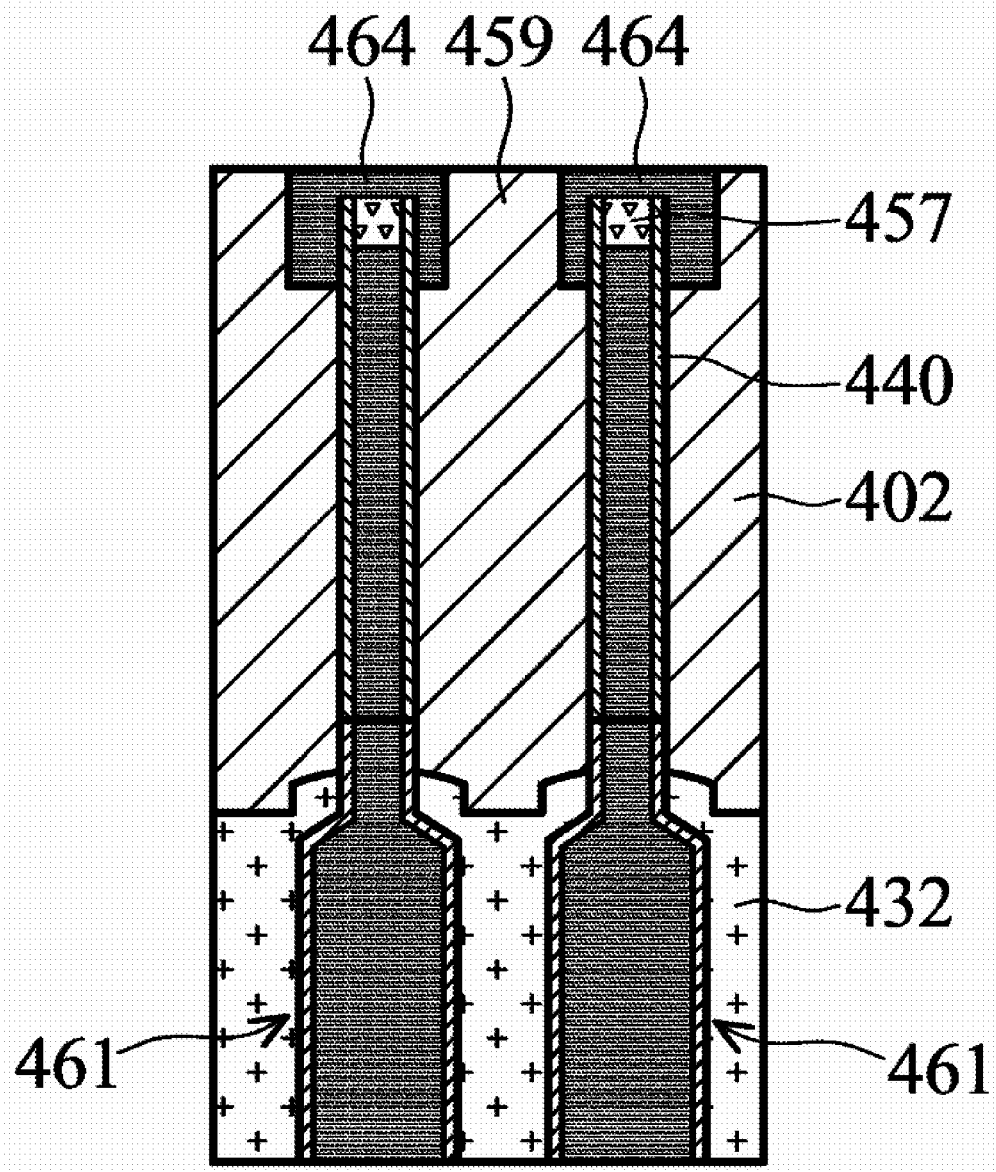
FIG. 21C shows a cross section along line II-II' of FIG. 21A.

Referring to FIG. 20A, FIG. 20B and FIG. 20C, an implanting process is performed to form a first region 460 of a buried strap 462 in the substrate 402 neighboring the central portion of the inner edge 454 of the C-shaped opening 428. A third polysilicon layer 457 is formed on the second polysilicon layer 438 in the C-shaped deep trench 430 by a deposition and etching process. It is noted that dopants in the third polysilicon layer 457 should diffuse into the substrate 402 during the thermal process to form a second region 458 of the buried strap 462 in the substrate 402 neighboring the central portion of the inner edge 454 of the C-shaped opening 428. Referring to FIG. 21A, FIG. 21B and FIG. 21C, a lithography process and an etching process are performed to define an active area 459, followed by depositing and etching back (or chemical mechanical polishing) dielectric material to form an insulating layer 464 covering the area excluding the active area 459. Thus, substantially completing a C-shaped deep trench capacitor 461 of the embodiment.

Figure 22A:
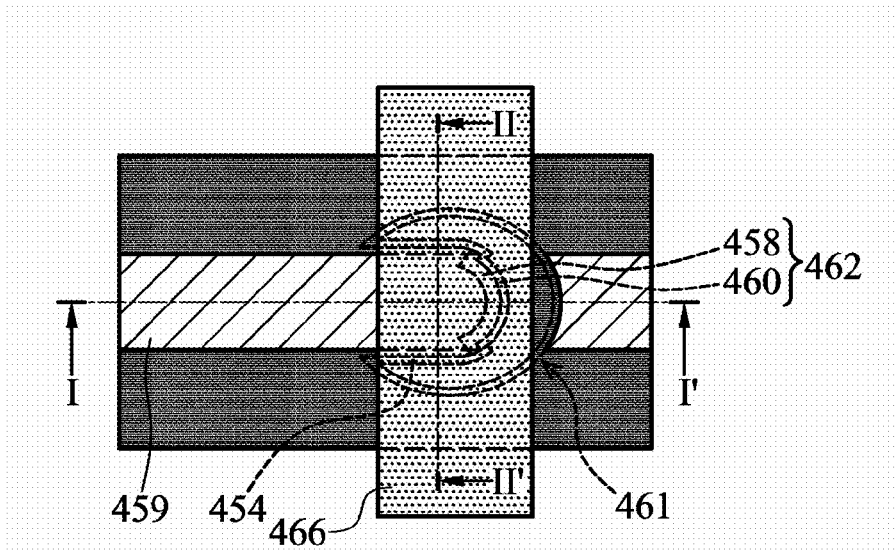
FIG. 22A shows the local plan view of the intermediate process step for forming the deep trench memory device of an embodiment of the invention.
Figure 22B:
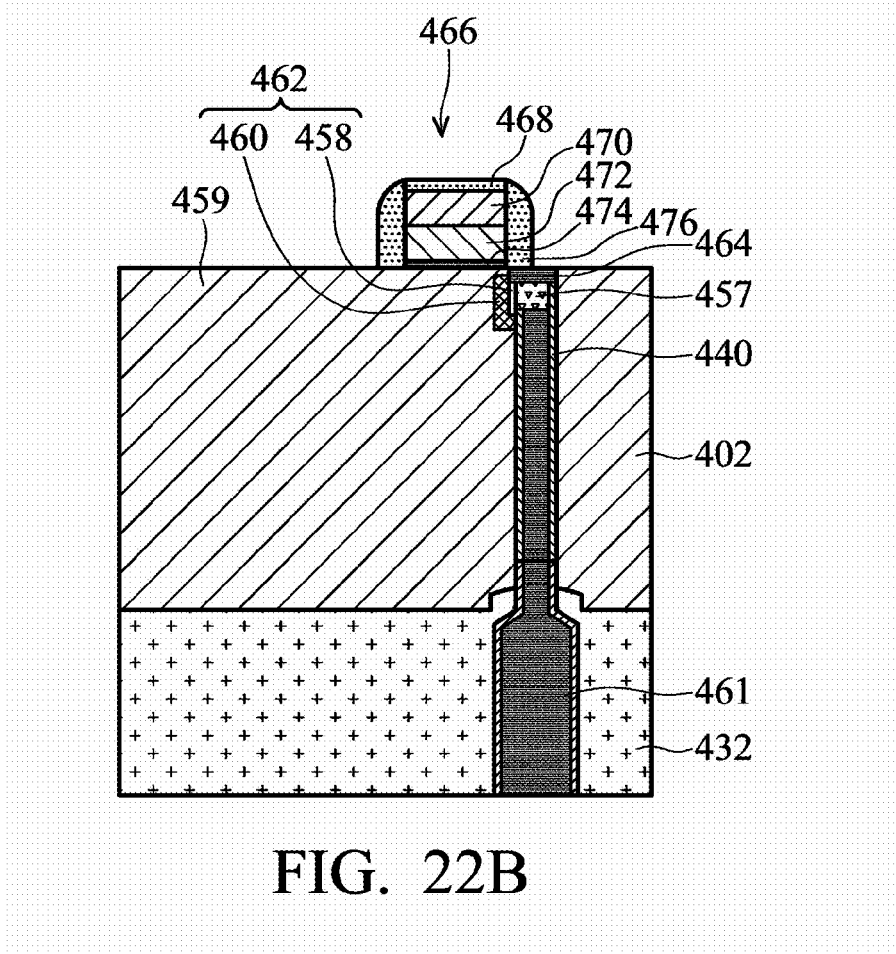
FIG. 22B shows a cross section along line I-I' of FIG. 22A.
Figure 22C:
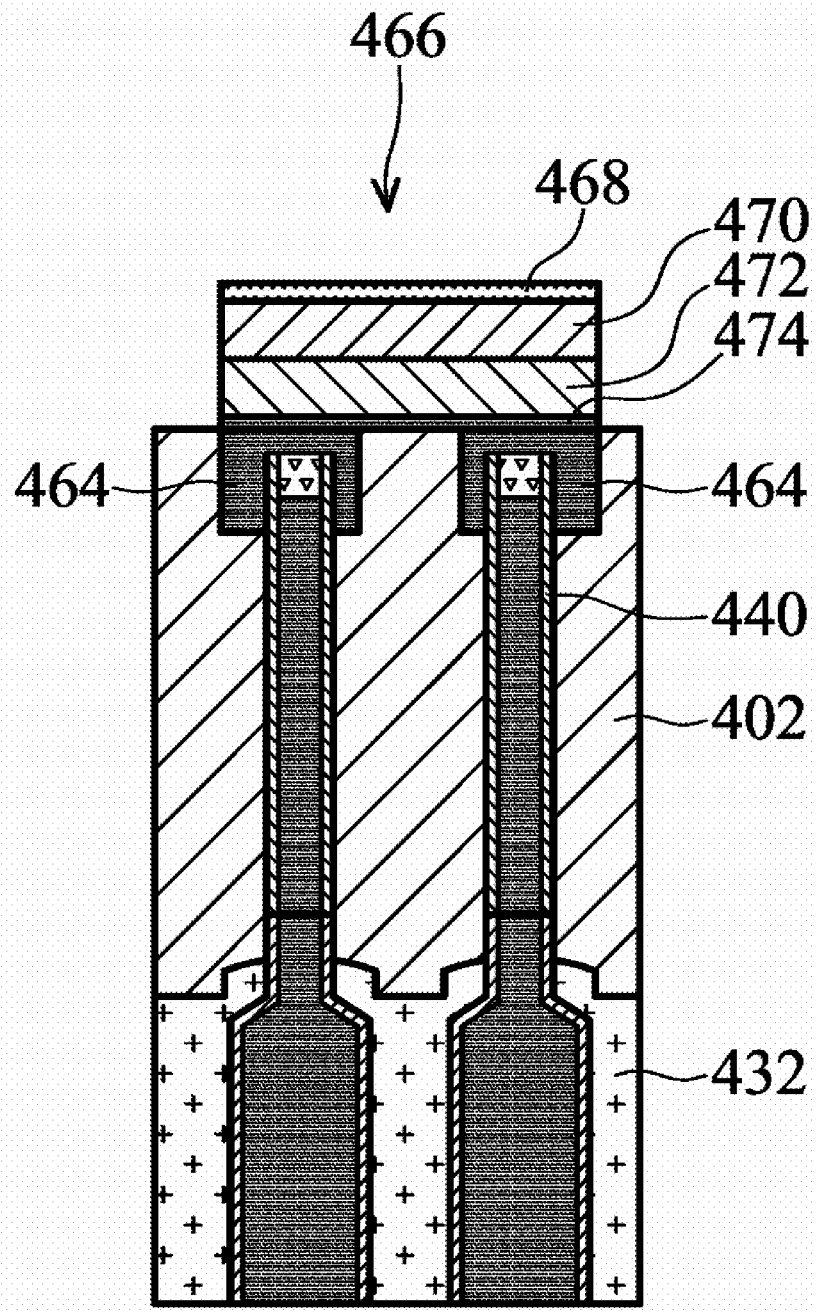
FIG. 22C shows a cross section along line II-II' of FIG. 22A.

Referring to FIG. 22A, FIG. 22B and FIG. 22C, a word line 466 crossing the active area 459 is formed. In the embodiment, the word line 466 comprises a gate oxide layer 474 over the surface level of the substrate 402, a polysilicon layer 472, a metal layer 470, a cap layer 468 and a spacer layer 476, and the word line 466 is specifically overlapped with a portion of the C-shaped deep trench capacitor 461 to reduce size of a unit cell and increase integrity. In a further embodiment of the invention, the word line 466 covers the two wing portions of the C-shaped pattern of the C-shaped deep trench capacitor 461 and exposes the central portion between the wing portions. Note that the embodiment only allows the word line to electrically connect to the C-shaped deep trench capacitor 461 through the portion of the buried strap 462 neighboring the central portion of the inner edge 454 of the C-shaped opening, while other conducting paths are isolated. Moreover, the buried strap 462 itself serves as a source/drain region and the entire buried strap 462 is disposed below the word line 466 to reduce length of the active area 459 and further make the unit cell square shaped to increase device integrity.

Figure 23A:
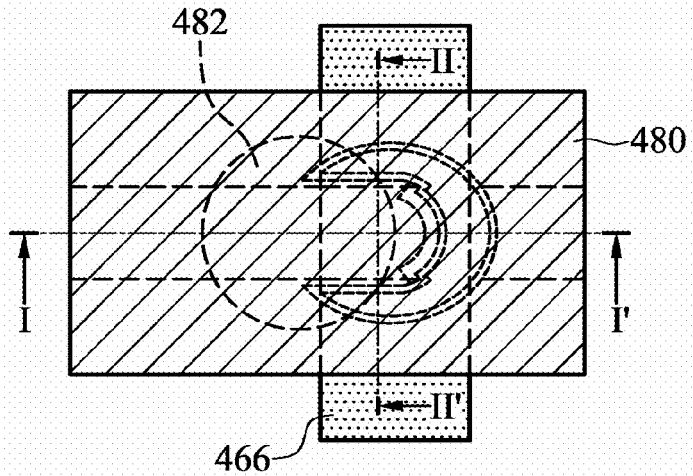
FIG. 23A shows the local plan view of the intermediate process step for forming the deep trench memory device of an embodiment of the invention.
Figure 23B:
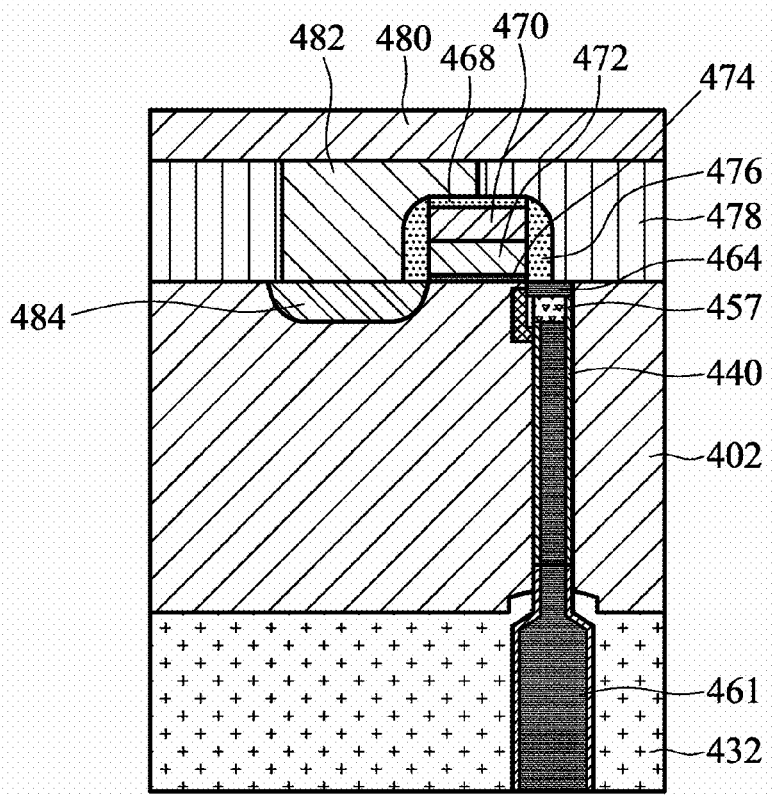
FIG. 23B shows a cross section along line I-I' of FIG. 23A.
Figure 23C:
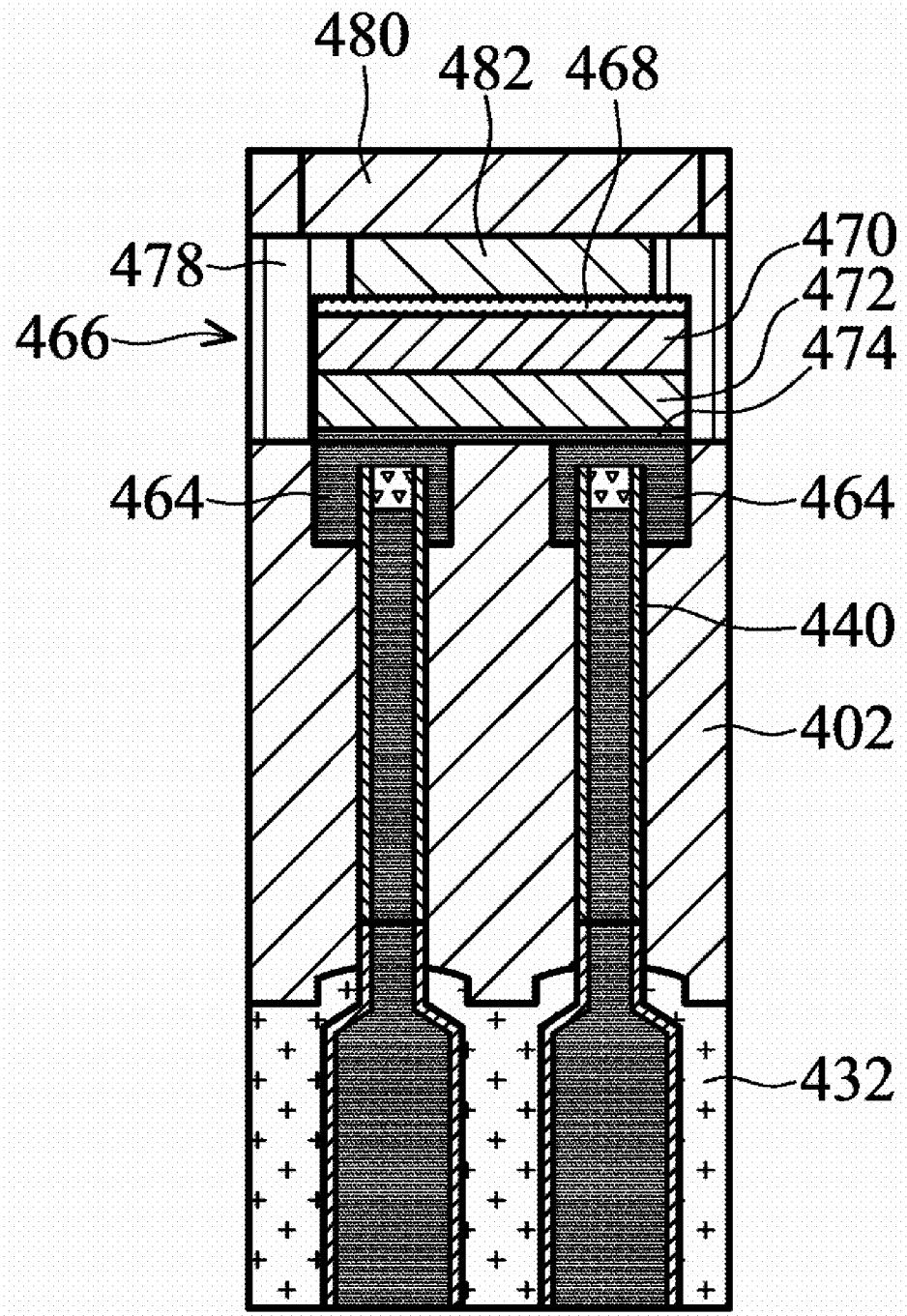
FIG. 23C shows a cross section along line II-II' of FIG. 23A.

Referring to FIG. 23A, FIG. 23B and FIG. 23C, a dielectric layer 478 is formed on the word line 466 and the substrate 402, followed by patterning the dielectric layer 478 to form an opening (not shown) and filling conductive materials into the opening to form a via 482. Since the word line 466 is isolated from other elements by the cap layer 468 and the spacer layer 476, the embodiment can increase size of the via 482 to overlap with a portion of the word line 466 and connect to the source/drain region 484. Next, a bit line 480 is formed to cross the word line 466 and connect to the via 482.

Figure 24A:
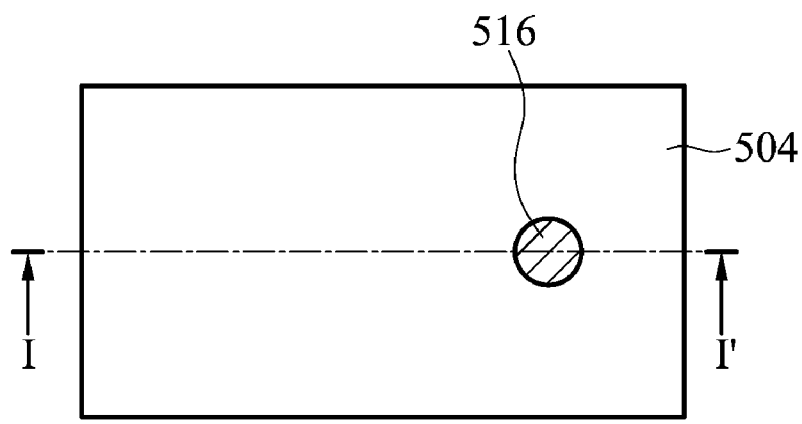
FIG. 24A shows the local plan view of the intermediate process step for forming the deep trench memory device of another embodiment of the invention.
Figure 24B:
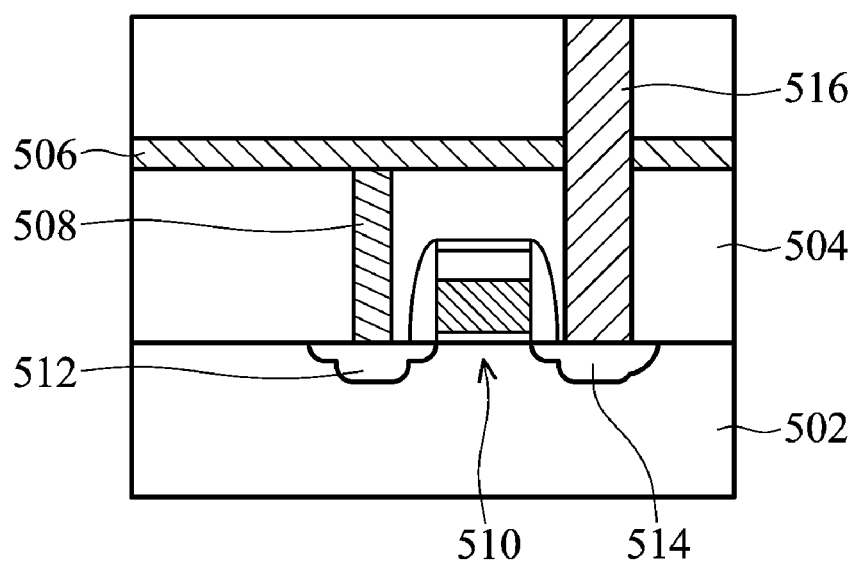
FIG. 24B shows a cross section along line I-I' of FIG. 24A.

The C-shaped capacitor can be applied not only in a deep trench capacitor memory device, but also a stack capacitor memory device. A method for forming a stack capacitor memory device of an embodiment of the invention is illustrated in accordance with FIG. 24A~FIG. 32B. First, referring to FIG. 24A and FIG. 24B, wherein FIG. 24A shows the local plan view of the intermediate process step for forming the stack capacitor memory device of the embodiment and FIG. 24B shows a cross section along line I-I' of FIG. 24A, a substrate 502 is provided, a word line 510 (gate line) is formed on the substrate 502 and drain/source region 514/512 are formed in the substrate 502. A dielectric layer 504 is formed on the word line 510 and the substrate 502, and a bit line 506 and a bit line contact 508 electrically connecting the bit line 506 and the drain/source region 512 are formed in the dielectric layer 504. The dielectric layer 504 is patterned by a lithography and etching process to form an opening (not shown), followed by filling the opening with conductive material, such as tungsten, to form a conductive contact 516 connecting to the drain/source region 514. Note that the following steps use the technique as illustrated in FIG. 5A~FIG. 12B.

Figure 25A:
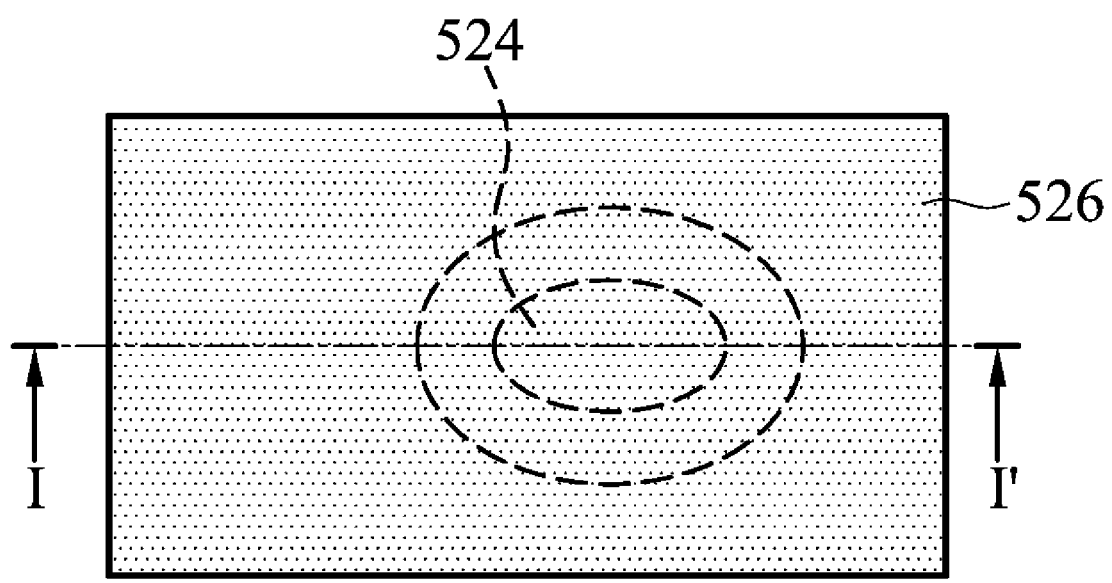
FIG. 25A shows the local plan view of the intermediate process step for forming the deep trench memory device of another embodiment of the invention.
Figure 25B:
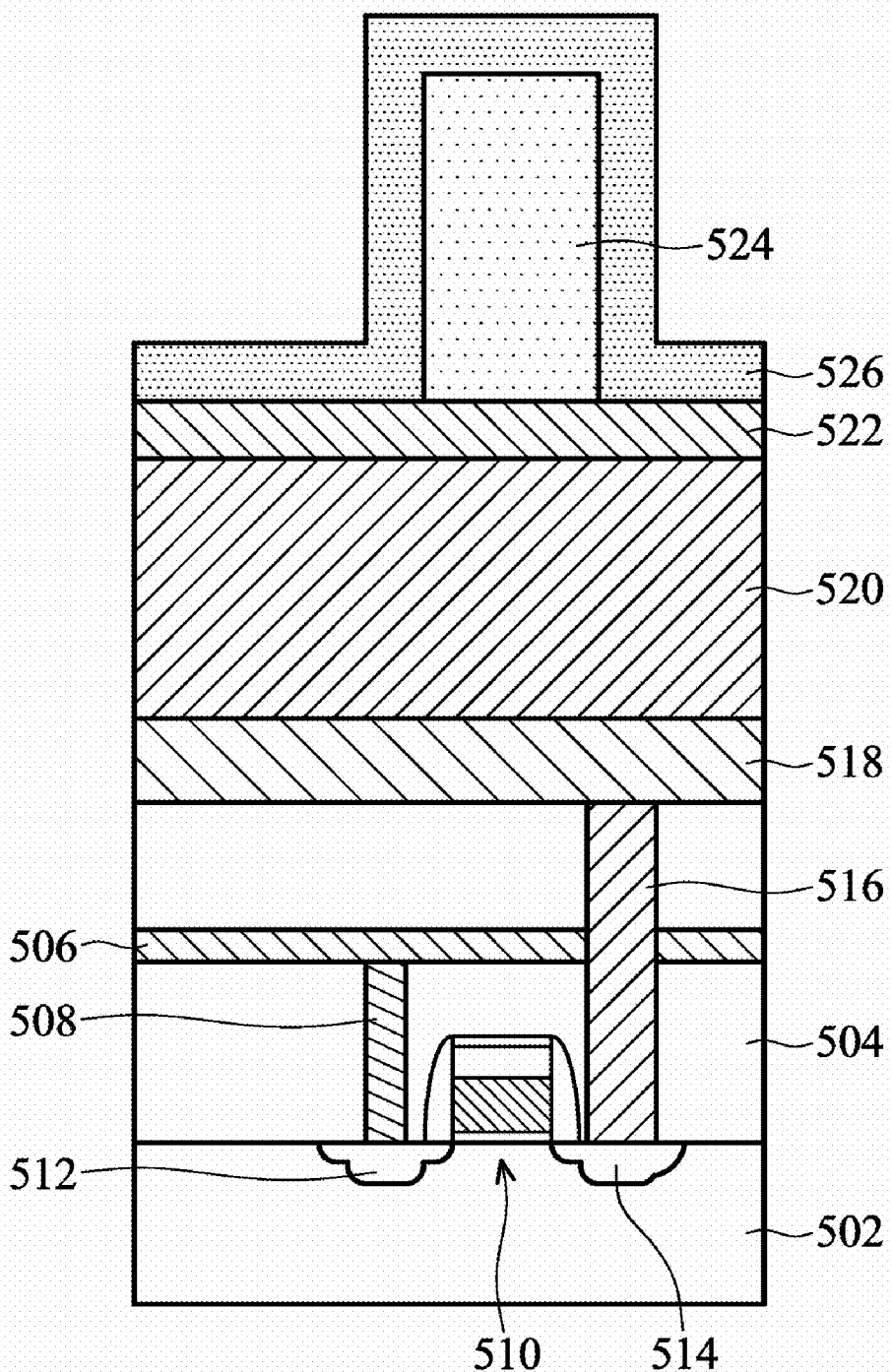
FIG. 25B shows a cross section along line I-I' of FIG. 25A.

Referring to FIG. 25A and FIG. 25B, a pad layer 518, an oxide layer 520, a carbon layer 522 and a first sacrificial layer (not shown) are sequentially formed on the dielectric layer 504 and the conductive contact 516. In the embodiment, the pad layer 518 can be silicon nitride, the oxide layer 520 can be $SiO_2$, BSG, PSG or BPSG, and the first sacrificial layer can be silicon nitride. Next, the first sacrificial layer is patterned to form a pillar structure 524, and an undoped polysilicon layer 526 is then conformally deposited on the pillar structure 524 and the carbon layer 522.

Figure 26A:
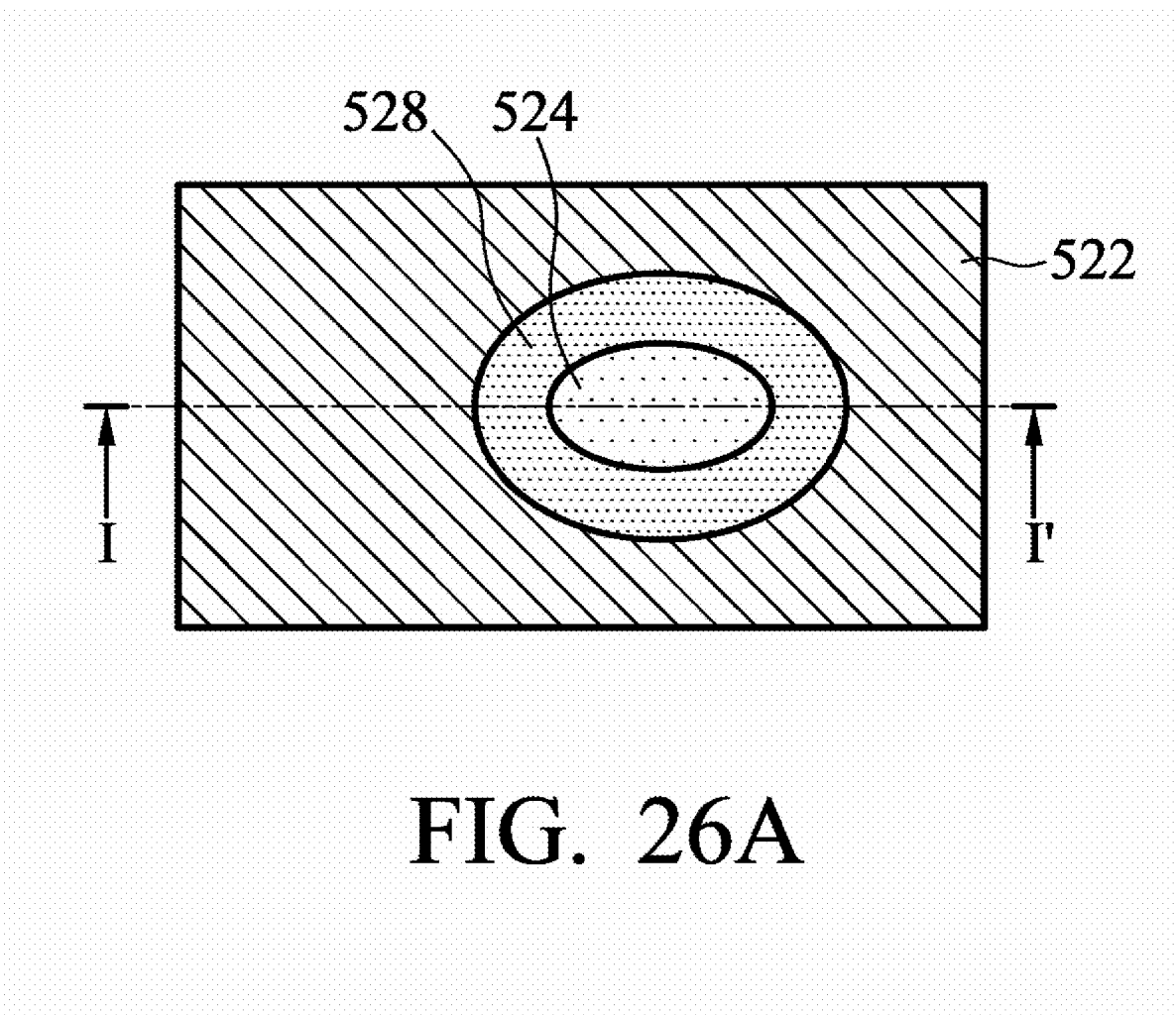
FIG. 26A shows the local plan view of the intermediate process step for forming the deep trench memory device of another embodiment of the invention.
Figure 26B:
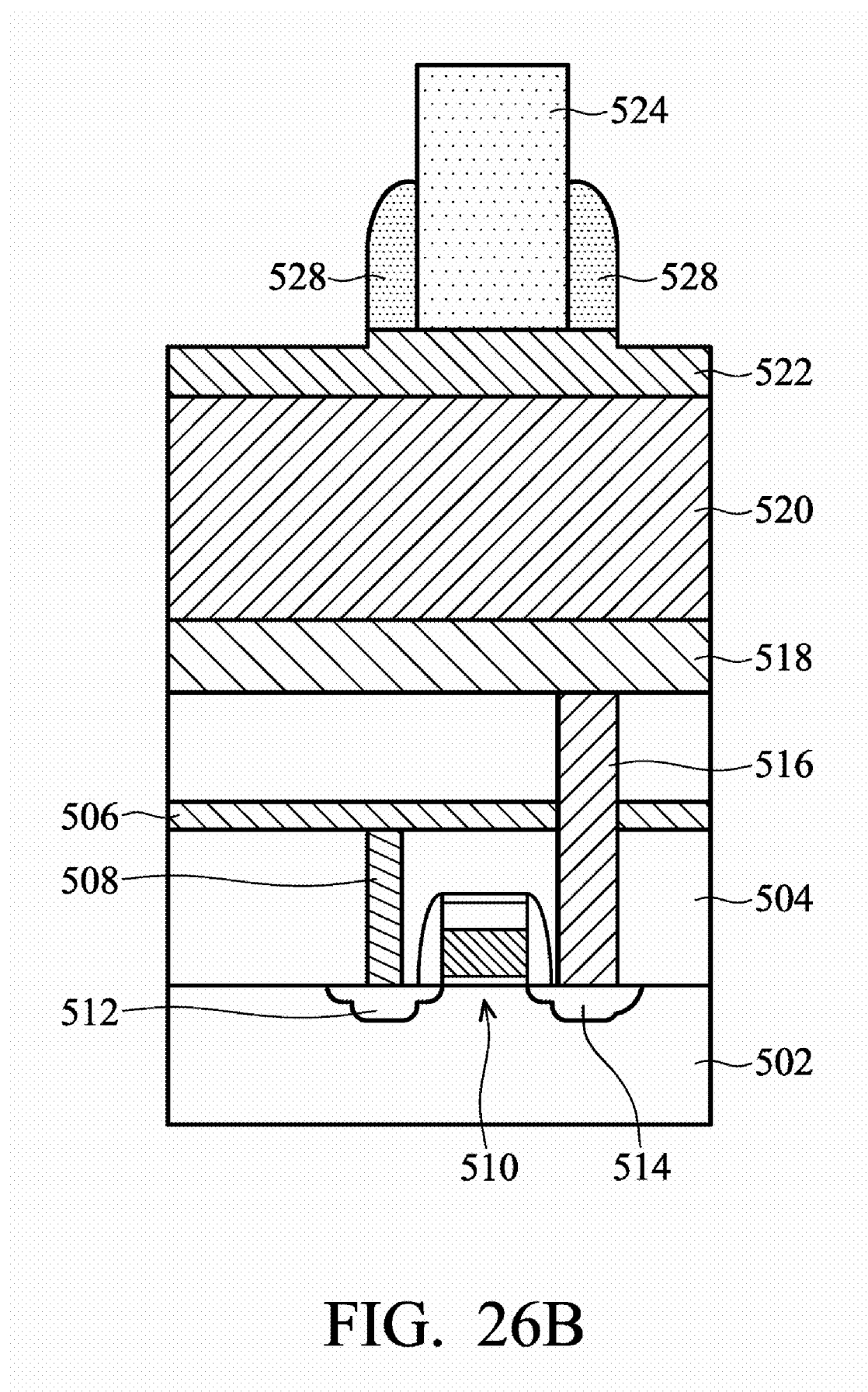
FIG. 26B shows a cross section along line I-I' of FIG. 26A.
Figure 27A:
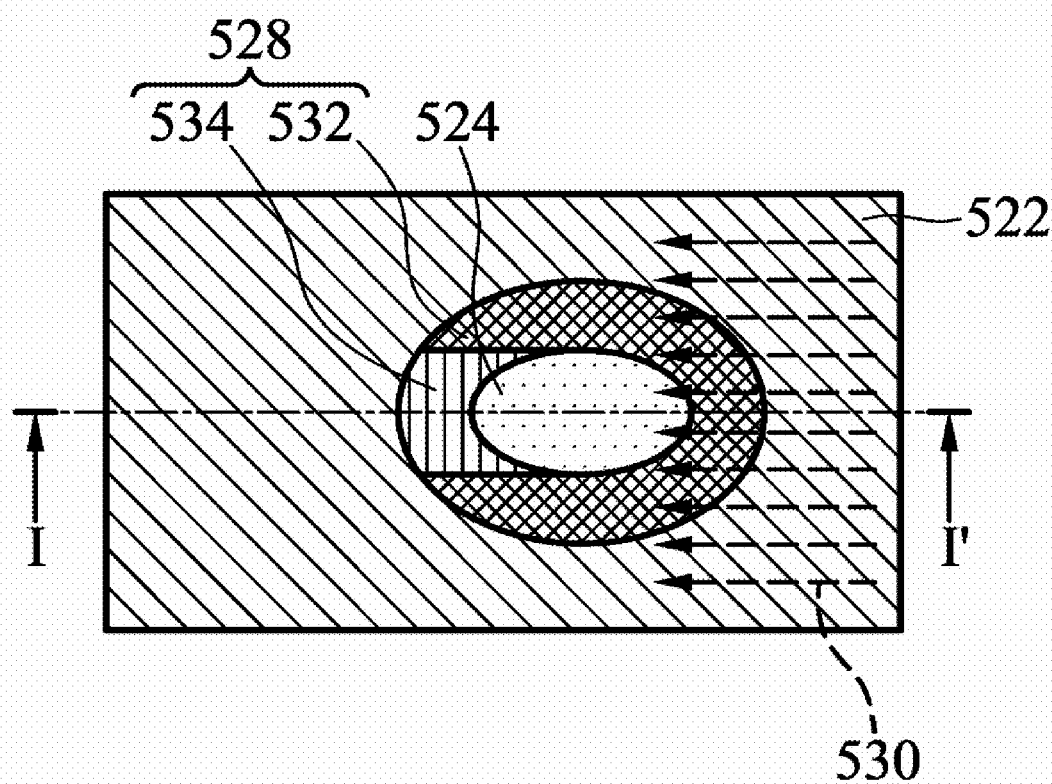
FIG. 27A shows the local plan view of the intermediate process step for forming the deep trench memory device of another embodiment of the invention.
Figure 27B:
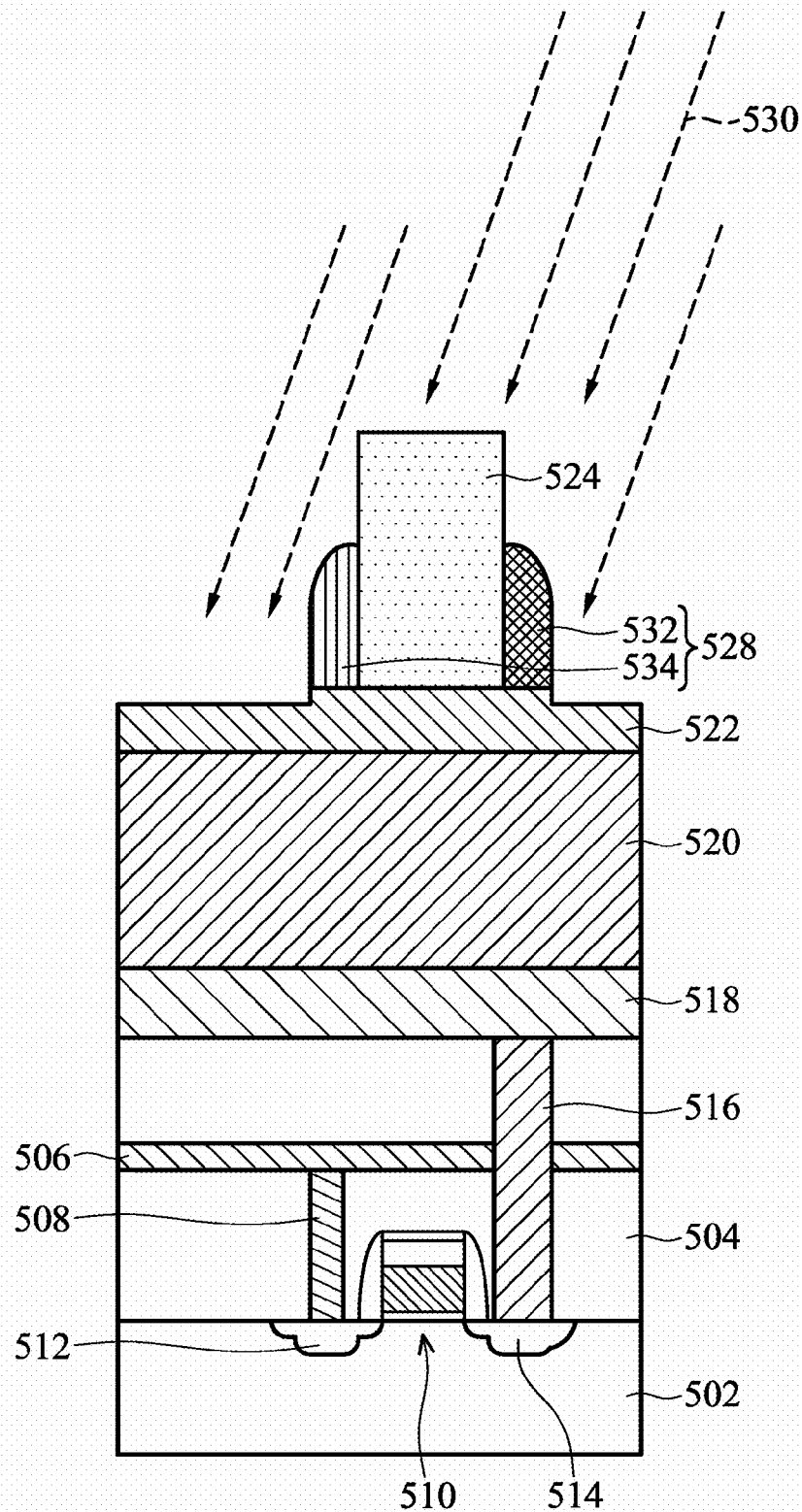
FIG. 27B shows a cross section along line I-I' of FIG. 27A.

Referring to FIG. 26A and FIG. 26B, the polysilicon layer 526 is anisotropically etched to form a ring-shaped spacer 528 surrounding the pillar structure 524. Referring to FIG. 27A and FIG. 27B, an implant process 530 with a tilt implanting angle is performed by dope $BF_2$ into the ring-shaped spacer 528, wherein a portion of the ring-shaped spacer 528 is not doped because some dopants are interrupted by the pillar structure 524. Therefore, as shown in FIG. 27A and FIG. 27B, the ring-shaped spacer 528 comprises a C-shaped doping portion 532 and an undoped portion 534.

Figure 28A:
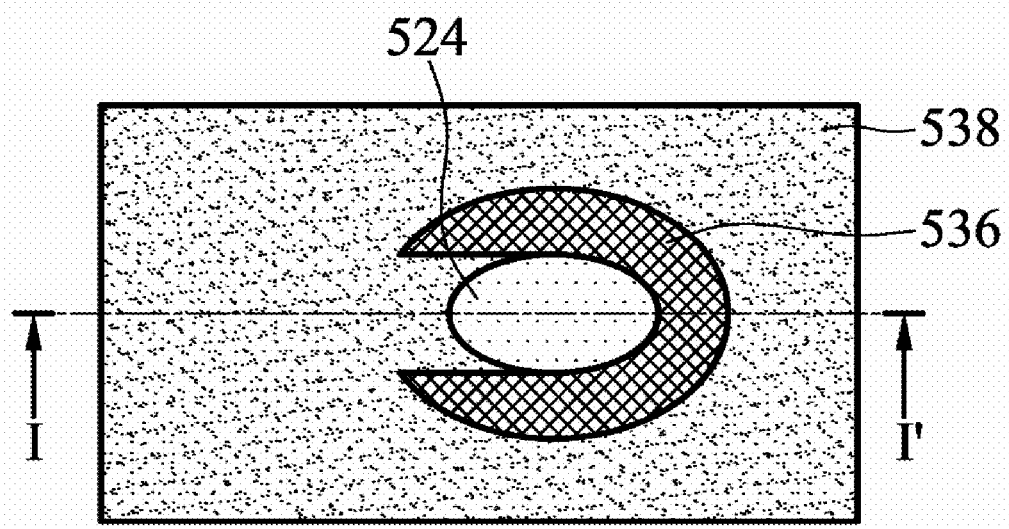
FIG. 28A shows the local plan view of the intermediate process step for forming the deep trench memory device of another embodiment of the invention.
Figure 28B:
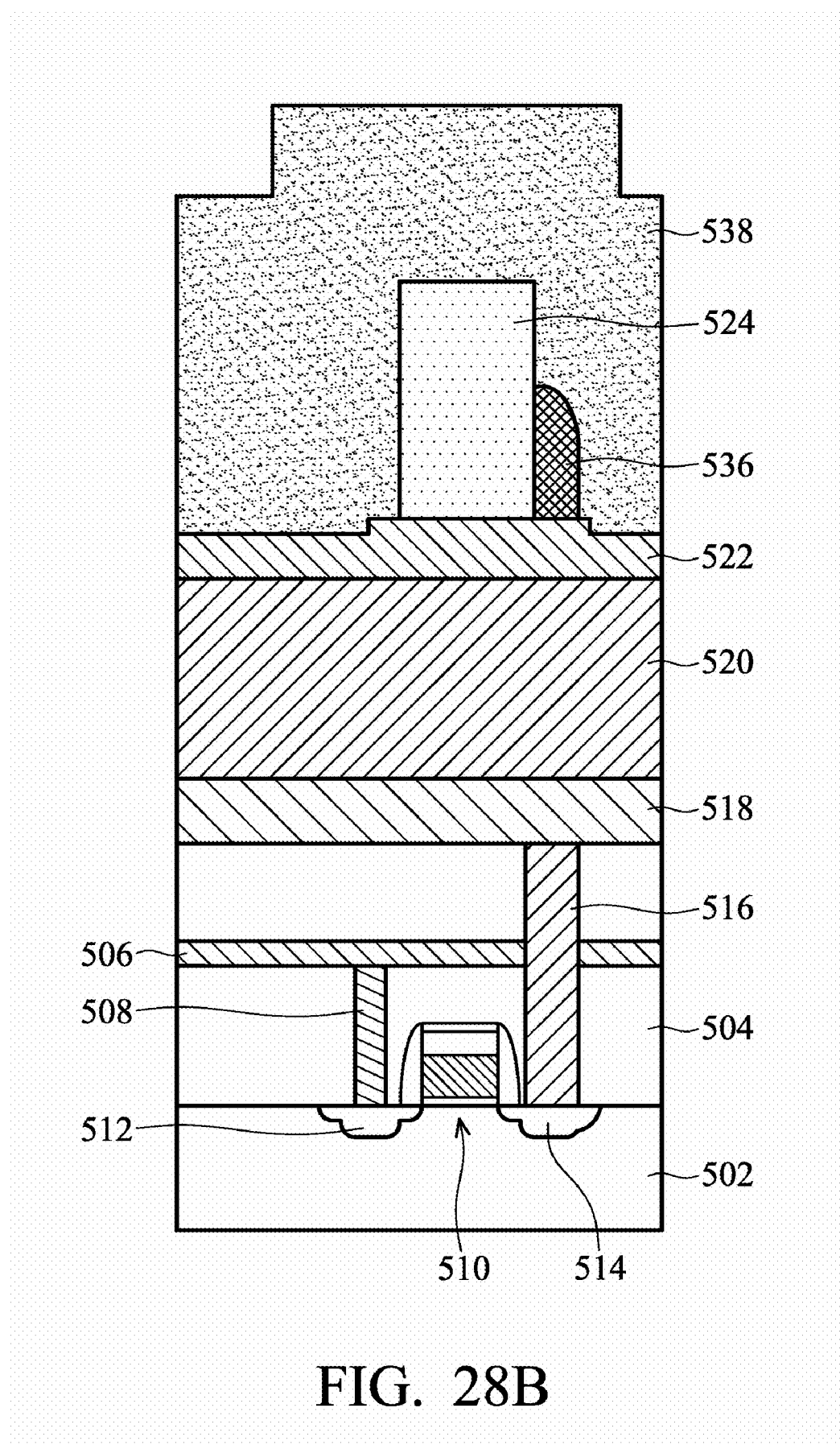
FIG. 28B shows a cross section along line I-I' of FIG. 28A.

Referring to FIG. 28A and FIG. 28B, an etching process using $NH_4OH$ as a primary etchant is performed and it is noted that the step of doping polysilicon with $BF_2$ decreases etching rate of $NH_4OH$. Therefore, the etching process can selectively remove the undoped portion 534 of the ring-shaped spacer 528 and leave the doped C-shaped doping portion 532 to form a C-shaped spacer 536. Next, a second sacrificial layer 538, such as silicon nitride, is blanketly deposited to cover the pillar structure 524 and the C-shaped spacer 536.

Figure 29A:
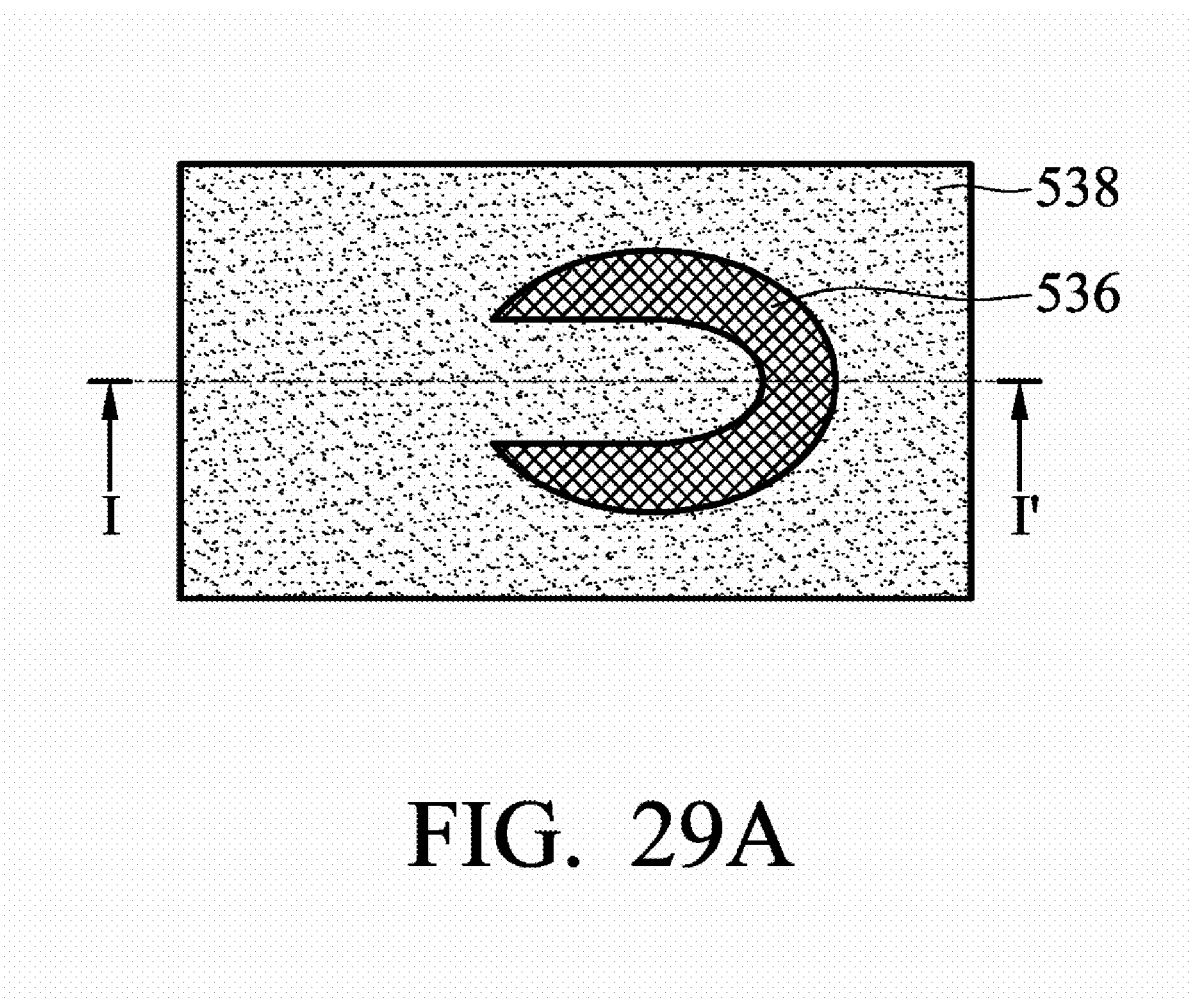
FIG. 29A shows the local plan view of the intermediate process step for forming the deep trench memory device of another embodiment of the invention.
Figure 29B:
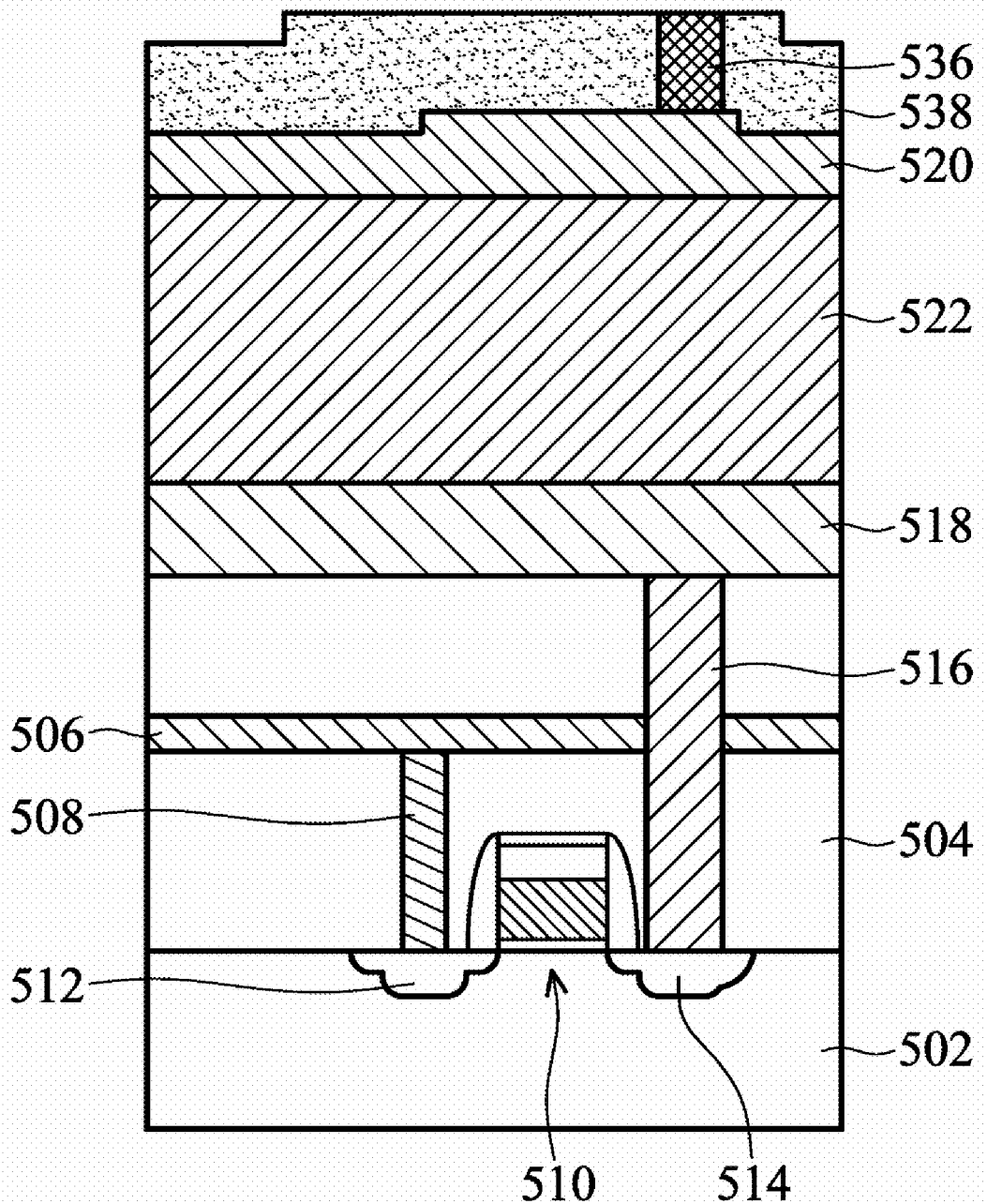
FIG. 29B shows a cross section along line I-I' of FIG. 29A.
Figure 30A:
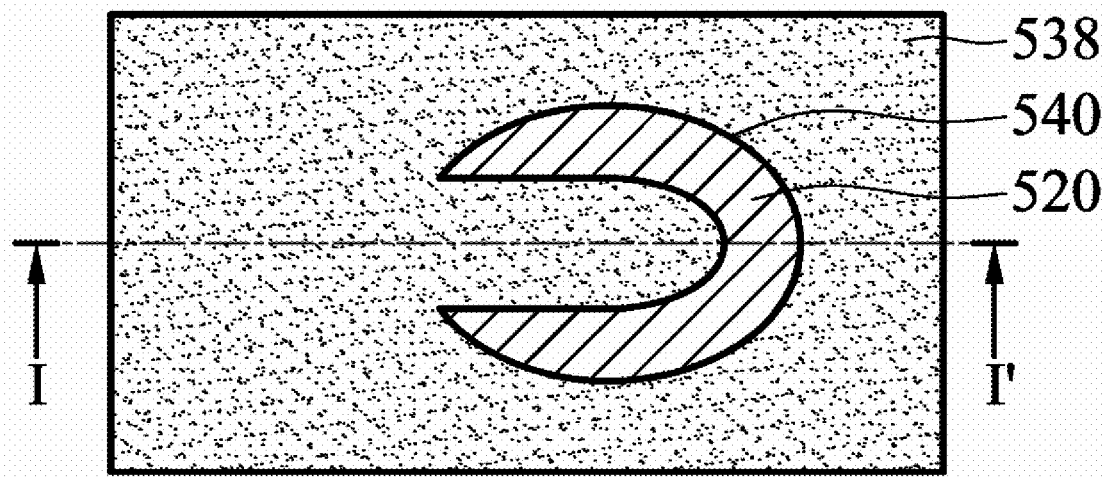
FIG. 30A shows the local plan view of the intermediate process step for forming the deep trench memory device of another embodiment of the invention.
Figure 30B:
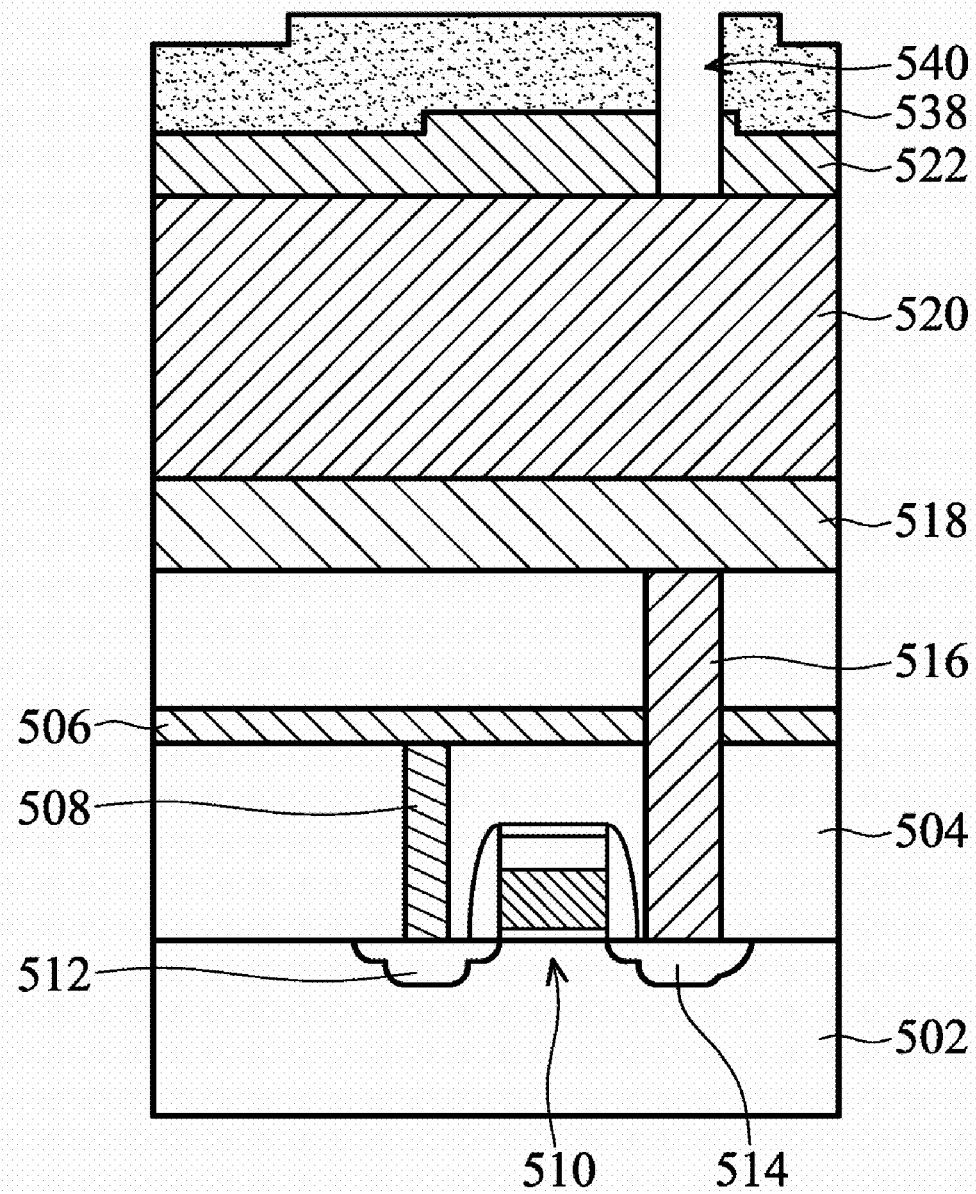
FIG. 30B shows a cross section along line I-I' of FIG. 30A.
Figure 31A:
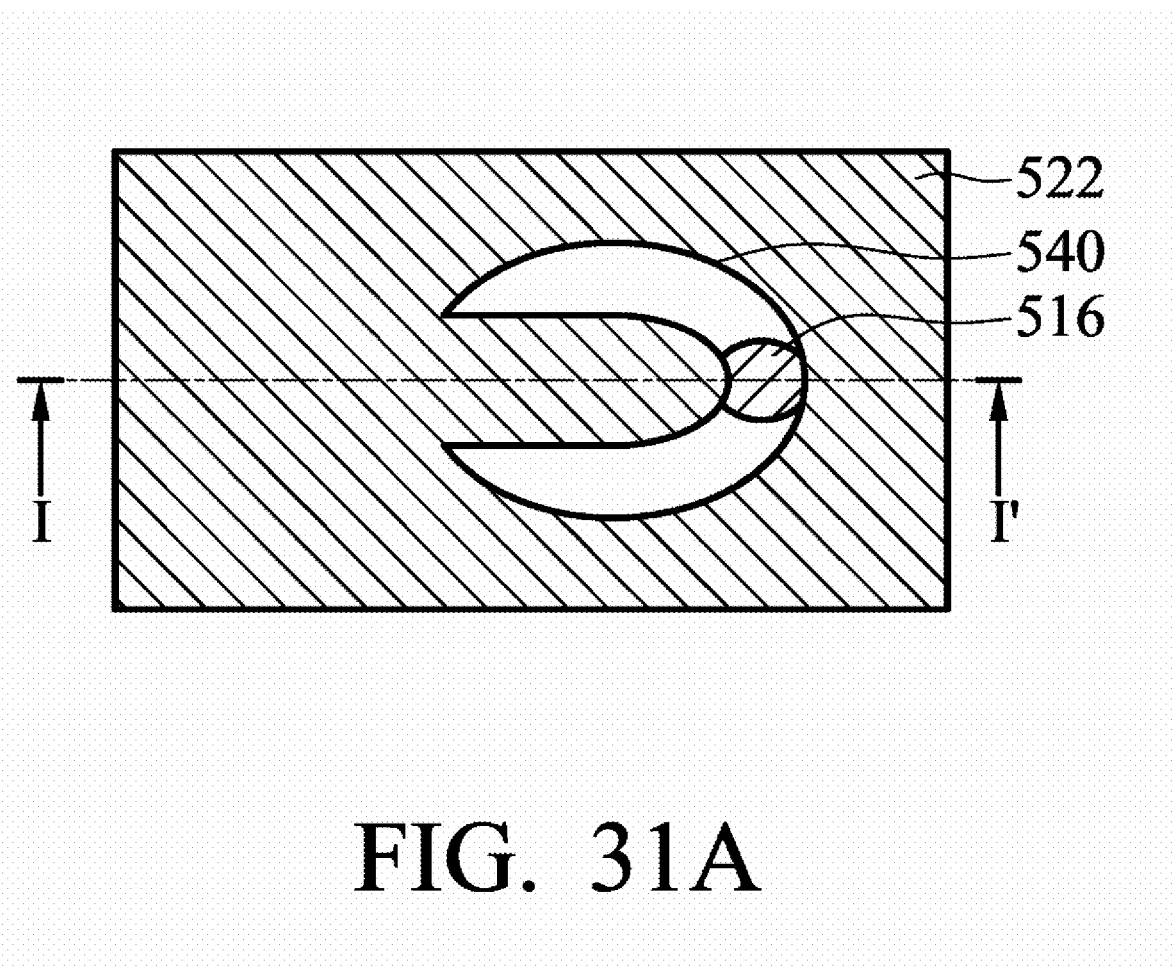
FIG. 31A shows the local plan view of the intermediate process step for forming the deep trench memory device of another embodiment of the invention.
Figure 31B:
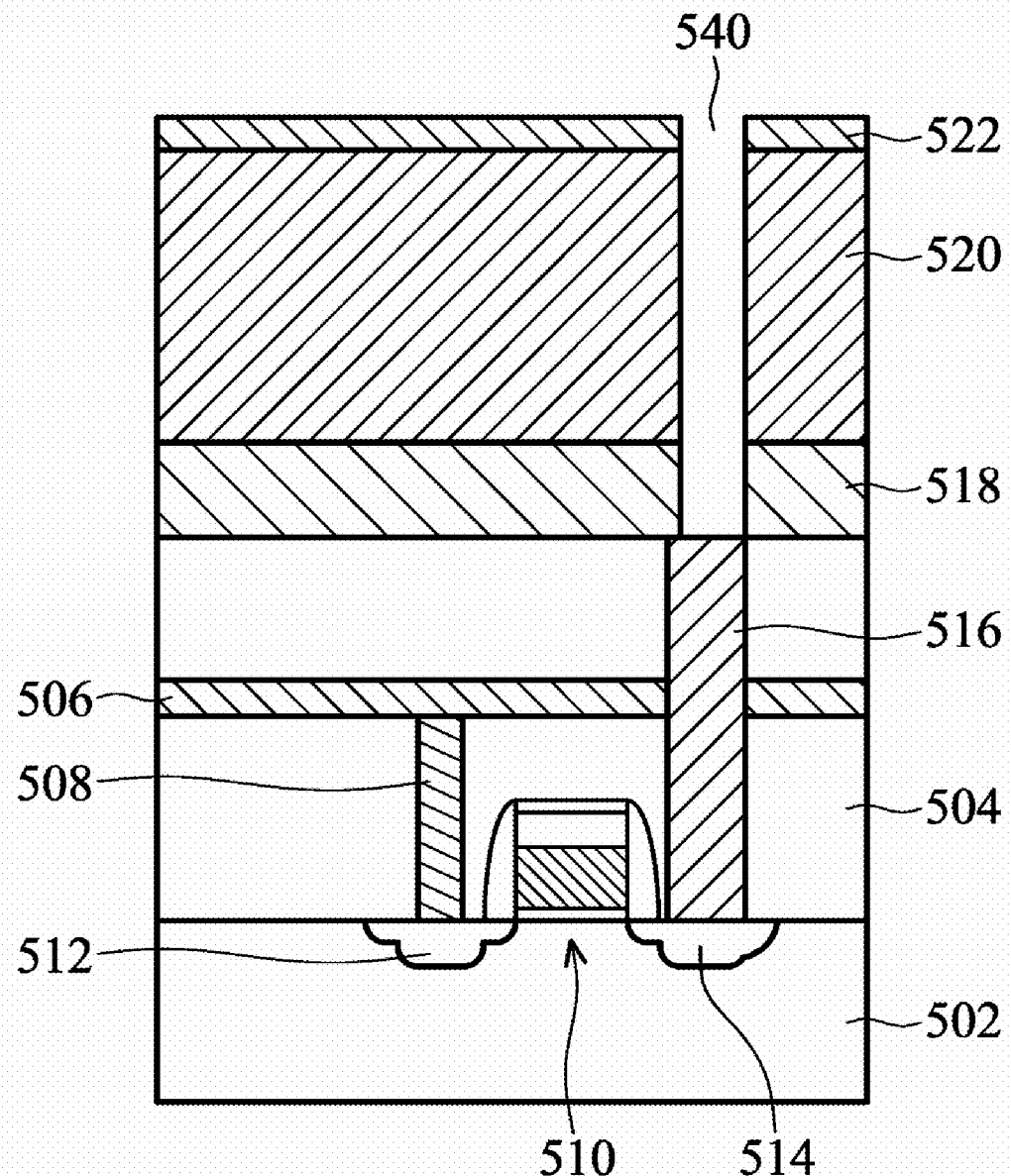
FIG. 31B shows a cross section along line I-I' of FIG. 31A.
Figure 32A:
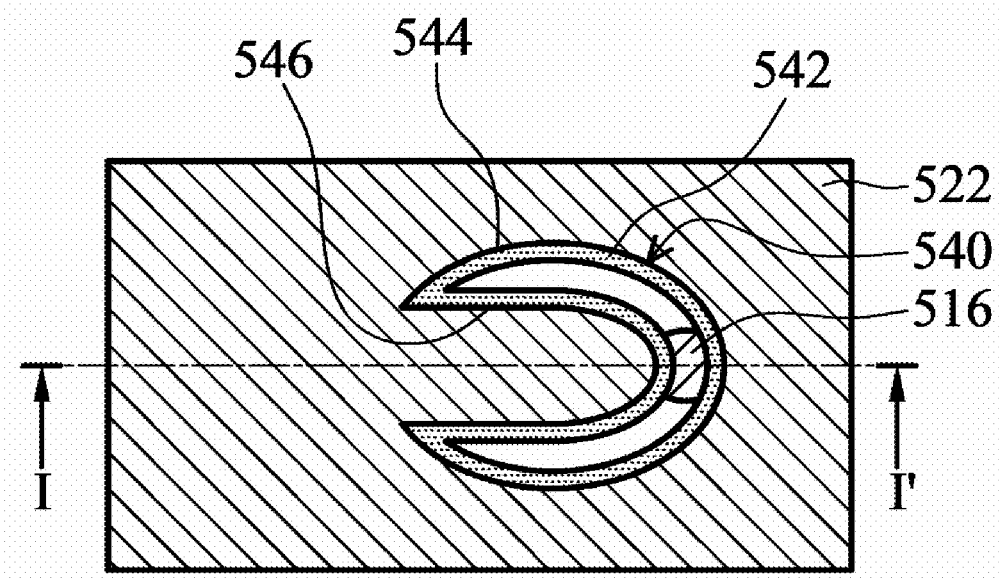
FIG. 32A shows the local plan view of the intermediate process step for forming the deep trench memory device of another embodiment of the invention.
Figure 32B:
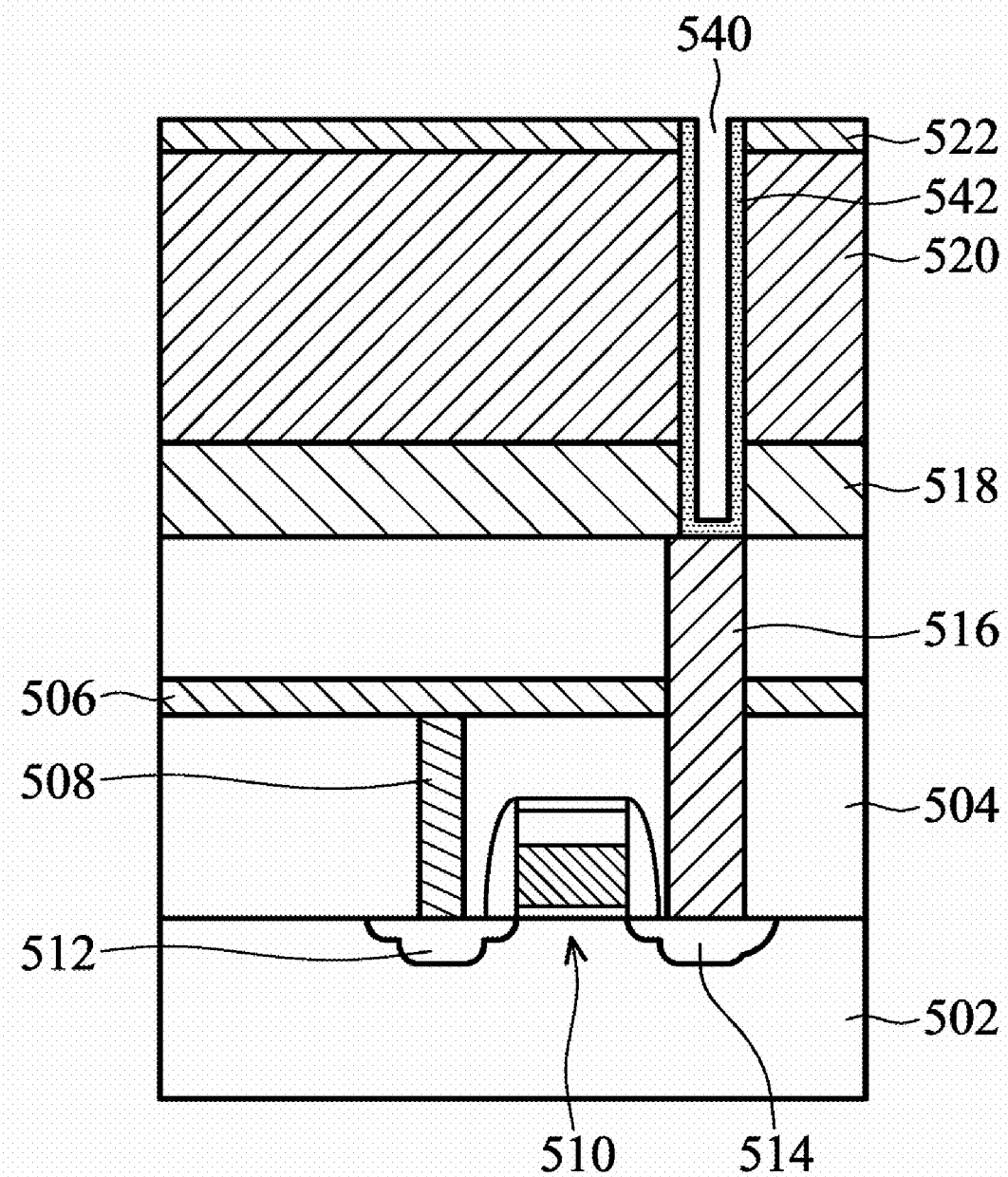
FIG. 32B shows a cross section along line I-I' of FIG. 32A.

Referring to FIG. 29A and FIG. 29B, a chemical mechanical polishing (CMP) process or an etching process is performed till the C-shaped spacer 536 is exposed. Referring to FIG. 30A and FIG. 30B, an wet etching process using $NH_4OH$ as main etchant with longer duration is performed to remove the C-shaped spacer 536 formed of polysilicon and form a C-shaped opening 540 in the second sacrificial layer 538. Next, the carbon layer 522 is etched using the second sacrificial layer 538 as a mask to transfer the pattern of the C-shaped opening 540 to the carbon layer 522. Referring to FIG. 31A and FIG. 31B, the second sacrificial layer 538 is removed and the oxide layer 520 and the pad layer 518 are then etched using the carbon layer 522 as a mask to transfer pattern of the C-shaped opening 540 to the oxide layer 520 and the pad layer 518. Referring to FIG. 32A and FIG. 32B, a capacitor 542 is conformally deposited in the C-shaped opening 540. It is noted that the invention does not limit the position of the C-shaped capacitor, but requires that the bottom layer of the capacitor must electrically connect to the conductive column 516.

The stack capacitor of the embodiment has a C-shaped pattern at a cross section parallel to a surface of the substrate 502. Note that the not only does the outer edge 544 of the C-shaped pattern of the capacitor provide surface area, but the inner edge 546 of the C-shaped pattern of the capacitor can also provide surface area for providing capacitance. Therefore, the capacitor of embodiments of the invention can provide sufficient surface area to meet requirements of new generation memory device.

The memory device and fabrication of the embodiments of the invention described have many advantages. For example, not only does the outer edge of the C-shaped pattern of the capacitor provide surface area, but the inner edge of the C-shaped pattern of the capacitor can also provide surface area for providing capacitance. Furthermore, lithography apparatus with high resolution is not required in the method for forming the memory device of the embodiments of the invention, thus, eliminating additional high costs related to new lithography apparatuses.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a memory device, comprising:
   providing a substrate;
   forming a capacitor in the substrate or overlying the substrate, wherein the capacitor has a C-shaped pattern at a cross section parallel to a surface of the substrate; and
   forming a word line on the substrate;
   wherein the capacitor is a C-shaped deep trench capacitor, and the step of forming the C-shaped deep trench capacitor comprises:
      patterning the substrate to form a C-shaped deep trench; and
      fabricating the C-shaped deep trench capacitor according to the C-shaped deep trench;
   wherein the step of fabricating the C-shaped deep trench capacitor according to the C-shaped deep trench comprises:
      forming a capacitor at a lower portion of the C-shaped deep trench and a first polysilicon layer is formed on the capacitor in the C-shaped deep trench;
      forming a collar dielectric layer covering an upper sidewall of the C-shaped deep trench;
      forming a second polysilicon layer on the capacitor in the C-shaped deep trench; and
      selectively opening a portion of the collar dielectric layer neighboring a central portion of an inner edge of the C-shaped deep trench;
   wherein the method for forming a memory device further comprises:
      performing at least one implanting process to dope a portion of the substrate neighboring the central portion of the inner edge of the C-shaped deep trench for forming a buried strap;
      forming a third polysilicon layer in the C-shaped deep trench and on the second polysilicon layer; and
      forming an insulating layer on the third polysilicon layer in the C-shaped deep trench.

2. The method for forming a method for forming a memory device as claimed in claim 1, wherein the step of patterning the substrate to form the C-shaped deep trench comprises:
   forming a hard mask layer on the substrate;
   forming a pillar structure on the hard mask layer;
   forming a ring-shaped spacer surrounding the pillar structure;
   selectively etching a portion of the ring-shaped spacer to form a C-shaped spacer;
   depositing a sacrificial layer to cover the C-shaped spacer, the pillar structure and the hard mask layer;
   polishing the sacrificial layer till the C-shaped spacer is exposed;
   removing the C-shaped spacer to form a C-shaped opening in the sacrificial layer;
   etching the hard mask layer using the sacrificial layer as a mask to transfer the pattern of the C-shaped opening to the hard mask layer; and
   etching the substrate using the hard mask layer as a mask to form the C-shaped deep trench.

3. The method for forming a memory device as claimed in claim 2, wherein the ring-shaped spacer is formed of polysilicon and the step of selectively etching a portion of the ring-shaped spacer to form the C-shaped spacer comprises:
   performing an implanting process with a tilt-angle to implant dopants into a portion of the ring-shaped spacer; and
   performing an etching process using $NH_4OH$ as a primary etchant to remove an undoped portion of the ring-shaped spacer, wherein the remaining doped portion of the ring-shaped spacer constitute the C-shaped spacer.

4. The method for forming a memory device as claimed in claim 1, wherein the step of opening the portion of the collar dielectric layer neighboring the central portion of the inner edge of the C-shaped deep trench comprises:
   conformally depositing a sacrificial polysilicon layer in the C-shaped deep trench;
   performing an implanting process with a tilt-angle to substantially implant dopants into a portion of the sacrificial polysilicon layer, wherein the portion neighboring the central portion of the inner edge of the C-shaped deep trench is not implanted;
   performing a selective etching process having a greater etching rate at the undoped portion of the sacrificial polysilicon layer than that of the doped portion of the sacrificial polysilicon layer; and
   etching the collar dielectric layer using the selectively etched sacrificial polysilicon layer as a mask,
   wherein dopants of the implanting process with the tilt-angle comprise $BF_2$ and the selective etching process uses $NH_4OH$ as a primary etchant.

5. The method for forming a memory device as claimed in claim 1, further comprising forming a word line on the insulating layer, the substrate and the buried strap, wherein the entire buried strap is covered by the word line.

* * * * *